United States Patent
Sakakibara et al.

(10) Patent No.: US 8,530,146 B2
(45) Date of Patent: Sep. 10, 2013

(54) METHOD FOR FORMING RESIST PATTERN

(75) Inventors: Hirokazu Sakakibara, Tokyo (JP); Hiromu Miyata, Tokyo (JP); Koji Ito, Tokyo (JP); Taiichi Furukawa, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/357,618

(22) Filed: Jan. 25, 2012

(65) Prior Publication Data

US 2012/0202150 A1 Aug. 9, 2012

(30) Foreign Application Priority Data

Feb. 4, 2011 (JP) ................................. 2011-023374
Aug. 29, 2011 (JP) ................................. 2011-186429
Sep. 15, 2011 (JP) ................................. 2011-202133

(51) Int. Cl.
*G03F 7/26* (2006.01)

(52) U.S. Cl.
USPC .......................................... 430/322

(58) Field of Classification Search
USPC ...................... 430/322, 270.1, 325
See application file for complete search history.

(56) References Cited

U.S. PATENT DOCUMENTS

| 2010/0203450 A1* | 8/2010 | Fujiwara et al. ........... 430/285.1 |
| 2010/0209827 A1* | 8/2010 | Ohashi et al. ..................... 430/5 |
| 2011/0177462 A1* | 7/2011 | Hatakeyama et al. ........ 430/325 |

FOREIGN PATENT DOCUMENTS

| JP | 06-12452 B2 | 5/1984 |
| JP | 59-93448 | 5/1984 |
| JP | 05-188598 | 7/1993 |
| JP | 2005-352384 | 12/2005 |
| JP | 2008-292975 | 12/2008 |
| JP | 2010-152353 | 7/2010 |
| JP | 2011-118335 | 6/2011 |
| JP | 2011-221509 | 11/2011 |
| WO | WO 2004/068242 | 8/2004 |

OTHER PUBLICATIONS

Japanese Office Action for corresponding JP Application No. 2011-202133, Mar. 21, 2012.

* cited by examiner

*Primary Examiner* — Brittany Raymond
(74) *Attorney, Agent, or Firm* — Ditthavong Mori & Steiner, P.C.

(57) ABSTRACT

A radiation-sensitive resin composition includes an acid-labile group-containing polymer and photoacid generator. The radiation-sensitive resin composition is used to form a resist pattern using a developer that includes an organic solvent in an amount of 80 mass % or more. The radiation-sensitive resin composition has a contrast value γ of 5.0 to 30.0. The contrast value γ is calculated from a resist dissolution contrast curve obtained when developing the radiation-sensitive resin composition using the organic solvent.

6 Claims, 1 Drawing Sheet

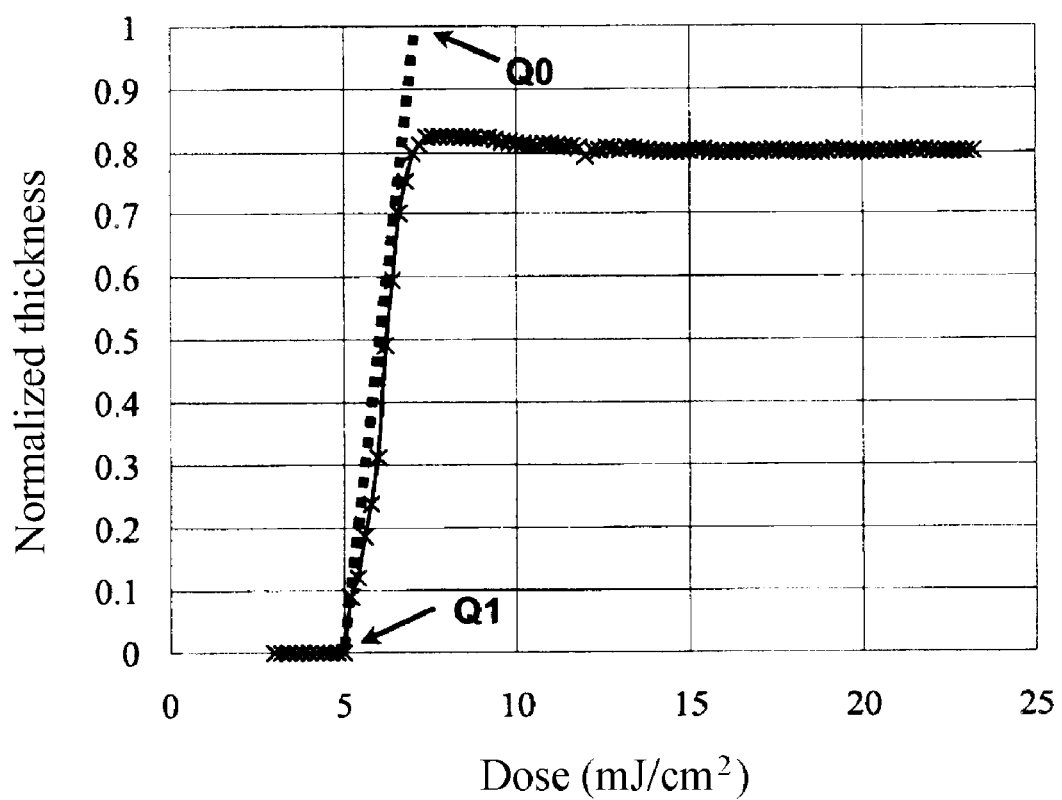

METHOD FOR FORMING RESIST PATTERN

CROSS-REFERENCE TO RELATED APPLICATIONS

The present application claims priority under 35 U.S.C. §119 to Japanese Patent Application No. 2011-023374, filed Feb. 4, 2011, to Japanese Patent Application No. 2011-186429, filed Aug. 29, 2011 and to Japanese Patent Application No. 2011-202133, filed Sep. 15, 2011. The contents of these applications are incorporated herein by reference in their entirety.

BACKGROUND OF THE INVENTION

1. Field of the Invention

The invention relates to a radiation-sensitive resin composition

2. Discussion of the Background

A reduction in the line width of a resist pattern used for lithography has been desired along with miniaturization of the structure of electronic devices (e.g., semiconductor devices and liquid crystal devices). A fine resist pattern having a line width of about 90 nm can be formed using short-wavelength radiation (e.g., ArF excimer laser light) and a radiation-sensitive resin composition that responds to short-wavelength radiation. However, it will be required to form a finer resist pattern in the future.

It is considered that a high resolution similar to that achieved when using a light source having a shorter wavelength can be implemented by liquid immersion lithography even if a light source having the same exposure wavelength is used. Therefore, liquid immersion lithography has attracted attention as technology that achieves high resolution while suppressing an increase in cost in the production of semiconductor devices that requires a large capital investment. However, liquid immersion lithography has a drawback in that a deterioration in performance may occur due to a deterioration in the resist film caused by elution of a substance from the resist film into the immersion medium or the like, a local change in refractive index of the immersion medium may occur due to the eluted substance, or the surface of the lens may be contaminated by the eluted substance, so that the lithographic properties may deteriorate (see WO04/068242).

The above drawback may be eliminated by changing the resist composition so that the resist film exhibits higher hydrophobicity.

SUMMARY OF THE INVENTION

According to one aspect of the present invention, a radiation-sensitive resin composition includes an acid-labile group-containing polymer and photoacid generator. The radiation-sensitive resin composition is used to form a resist pattern using a developer that includes an organic solvent in an amount of 80 mass % or more. The radiation-sensitive resin composition has a contrast value γ of 5.0 to 30.0. The contrast value γ is calculated from a resist dissolution contrast curve obtained when developing the radiation-sensitive resin composition using the organic solvent.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawing.

FIG. 1 is a view showing a resist dissolution contrast curve.

DESCRIPTION OF THE EMBODIMENTS

According to an embodiment of the invention, a radiation-sensitive resin composition that is used to form a resist pattern using a developer that includes an organic solvent in an amount of 80 mass % or more, includes (A) an acid-labile group-containing polymer (hereinafter may be referred to as "polymer (A)"), and (B) a photoacid generator, and has a contrast value γ of 5.0 to 30.0, the contrast value γ being calculated from a resist dissolution contrast curve obtained when developing the radiation-sensitive resin composition using the organic solvent.

Since the radiation-sensitive resin composition has a contrast value γ of 5.0 to 30.0, the radiation-sensitive resin composition exhibits sufficient sensitivity, and also exhibits an improved exposure latitude (EL), depth of focus (DOF), critical dimension uniformity (CDU), and mask error enhancement factor (MEEF).

The organic solvent is preferably at least one organic solvent selected from the group consisting of alkyl carboxylates having 3 to 7 carbon atoms and dialkyl ketones having 3 to 10 carbon atoms. The contrast value γ of the radiation-sensitive resin composition can be controlled within a more desired range by utilizing the above specific organic solvent as the developer.

The polymer (A) preferably includes a structural unit (I) shown by a formula (1) and a structural unit (II) shown by a formula (2).

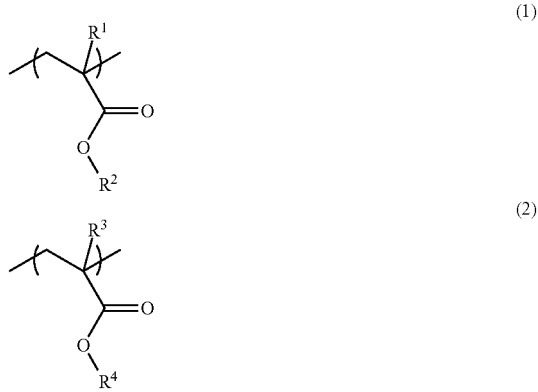

wherein $R^1$ represents a hydrogen atom, a fluorine atom, a methyl group, or a trifluoromethyl group, $R^2$ represents a monovalent acid-labile group that is a linear or branched hydrocarbon group having 1 to 9 carbon atoms or an alicyclic group having 4 to 20 carbon atoms, provided some or all of the hydrogen atoms of the alicyclic group may be substituted with a substituent, $R^3$ represents a hydrogen atom, a fluorine atom, a methyl group, or a trifluoromethyl group, and $R^4$ represents a monovalent non-acid-labile group that has an alicyclic structure and includes a polar group.

The contrast value γ under the development conditions employed for the radiation-sensitive resin composition can be set within the above specific range by incorporating the structural unit (I) that includes an acid-labile group and the non-acid-labile structural unit (II) that includes a polar group in the polymer (A), and adjusting (selecting) the types and the content of the structural unit (I) and the structural unit (II). As a result, the contrast value γ decreases (i.e., a change in film thickness due to development with respect to the dose of radiation decreases) as compared with the case where the polymer (A) does not include the structural unit (II), so that the EL, DOF, CDU, and MEEF can be improved.

$R^4$ preferably represents a group that has a polyalicyclic structure, and includes a carbonyl group, a hydroxyl group, or a cyano group as the polar group. The affinity of the polymer (A) to the developer can be adjusted when $R^4$ represents a group that has the above specific structure. This makes it possible to achieve a more appropriate contrast value γ, so that the EL, DOF, CDU, and MEEF can be further improved.

The content of the structural unit (II) in the polymer (A) is preferably 1 to 30 mol %. The contrast value γ can be controlled within a more desired range by setting the content of the structural unit (II) in the polymer (A) within the above specific range.

The polymer (A) preferably further includes a structural unit (III) that includes a lactone-containing group or a cyclic carbonate-containing group. The contrast value γ can be controlled within a more desired range when the polymer (A) further includes the structural unit (III).

Note that the contrast value γ is calculated by the following expression.

$$\gamma=|\log_{10}(Q^0/Q^1)|^{-1}$$

The vertical axis of the resist dissolution contrast curve indicates the normalized thickness of the resist, and the horizontal axis of the resist dissolution contrast curve indicates the dose of an ArF excimer laser beam at intervals of 0.1 mJ/cm² (range: 3 to 23.0 mJ/cm²)). Note that "$Q^0/Q^1$" indicates the slope of a straight line that approximates the measurement points of the rising edge of a resist dissolution contrast curve shown in FIG. 1. The term "normalized thickness" used herein refers to a thickness with respect to the thickness of a resist film obtained by applying a solution of the radiation-sensitive resin composition to a silicon wafer at 1500 rpm using a spin coater, and baking the resulting film at 90° C. for 60 seconds. Note that the term "radiation" used herein includes visible rays, ultraviolet rays, deep ultraviolet rays, X-rays, charged particle rays, EUV, and the like.

The embodiment of the invention thus provides a radiation-sensitive resin composition that exhibits sufficient sensitivity, and also exhibits an excellent EL, DOF, CDU, and MEEF. The radiation-sensitive resin composition may suitably be used for production of semiconductor devices that are expected to be further miniaturized in the future. The embodiments will now be described.

<Radiation-Sensitive Resin Composition>

A radiation-sensitive resin composition according to one embodiment of the invention that is used to form a resist pattern using a developer that includes an organic solvent in an amount of 80 mass % or more includes the polymer (A) and the photoacid generator (B). The radiation-sensitive resin composition preferably further includes (C) a polymer that has a fluorine atom content higher than that of the polymer (A) (hereinafter may be referred to as "polymer (C)"), (D) an acid diffusion controller, and (E) a solvent. The radiation-sensitive resin composition may further include an additional optional component as long as the effects of the invention are not impaired. Each component and a resist pattern-forming method are described in detail below.

<Polymer (A)>

The polymer (A) is a base polymer that includes an acid-labile group. The term "base polymer" used herein refers to a polymer that is used as the main component of a resist pattern formed using the radiation-sensitive resin composition, and is preferably included in the resist pattern in an amount of 50 mass % or more based on the total polymers. The term "acid-labile group" used herein refers to a group that substitutes a hydrogen atom of a polar functional group (e.g., carboxyl group), and dissociates due to an acid generated by the photoacid generator (B) upon exposure.

The polymer (A) preferably includes the structural unit (I) and the structural unit (II). The contrast value γ under the development conditions employed for the radiation-sensitive resin composition can be set within the above specific range by incorporating the structural unit (I) that includes an acid-labile group and the non-acid-labile structural unit (II) that includes a polar group in the polymer (A), and adjusting (selecting) the types and the content of the structural unit (I) and the structural unit (II). The contrast value γ decreases as compared with the case where the polymer (A) does not include the structural unit (II) (i.e., a change in film thickness due to development with respect to the dose of radiation decreases), so that the EL, DOF, CDU, and MEEF can be improved. The polymer (A) preferably further includes a structural unit (III) that includes a lactone-containing group or a cyclic carbonate-containing group. The contrast value γ can be controlled within a more desired range when the polymer (A) further includes the structural unit (III). Note that the polymer (A) may include two or more types of each structural unit. Each structural unit is described in detail below.

Structural Unit (I)

The structural unit (I) is shown by the formula (1). $R^1$ in the formula (1) represents a hydrogen atom, a fluorine atom, a methyl group, or a trifluoromethyl group, and $R^2$ represents a monovalent acid-labile group that is a linear or branched hydrocarbon group having 1 to 9 carbon atoms or an alicyclic group having 4 to 20 carbon atoms, provided some or all of the hydrogen atoms of the alicyclic group may be substituted with a substituent.

Examples of the linear or branched hydrocarbon group having 1 to 9 carbon atoms represented by $R^2$ include a methyl group, an ethyl group, an n-propyl group, an i-propyl group, an n-butyl group, a 2-methylpropyl group, a 1-methylpropyl group, a t-butyl group, and the like.

Examples of the alicyclic hydrocarbon group having 4 to 20 carbon atoms represented by $R^2$ include polyalicyclic groups (e.g., adamantane skeleton and norbornane skeleton) and monoalicyclic groups (e.g., cyclopentane and cyclohexane). Some or all of the hydrogen atoms of these alicyclic groups may be substituted with at least one group selected from linear, branched, or cyclic alkyl groups having 1 to 10 carbon atoms, for example.

Examples of the structural unit (I) include structural units shown by the following formulas, and the like.

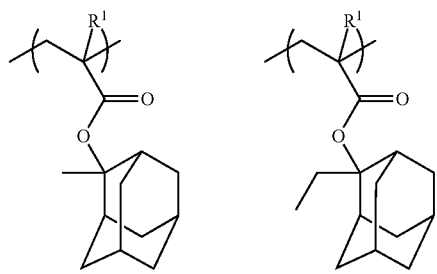

-continued

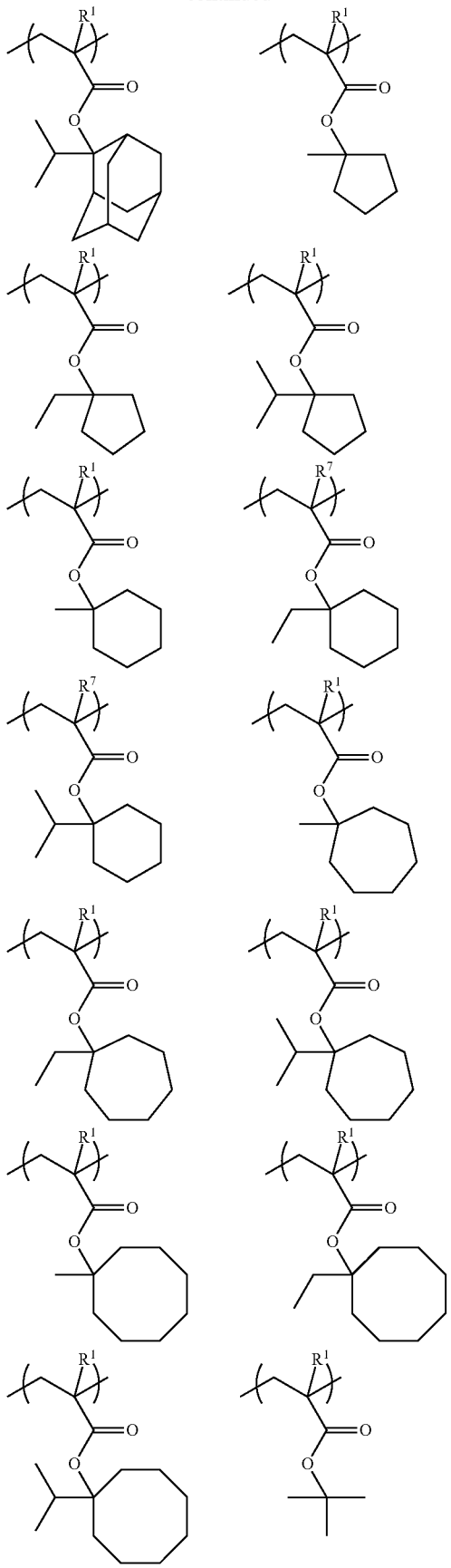

-continued

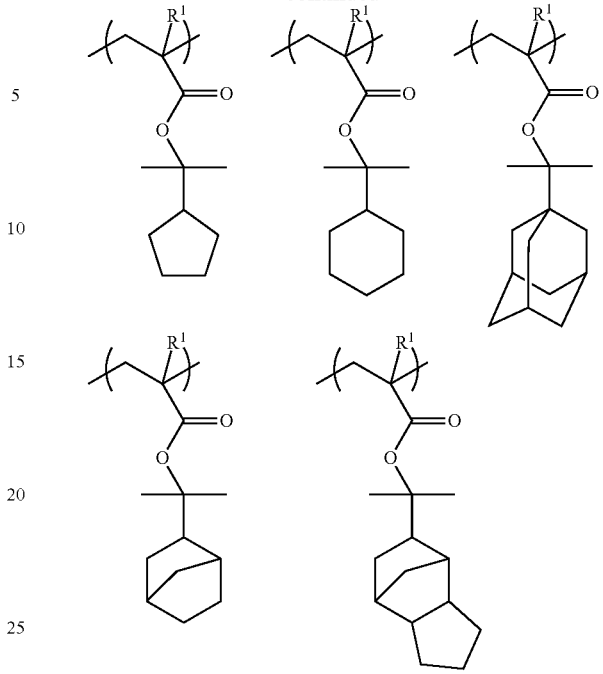

wherein $R^1$ is the same as defined for the formula (1).

The content of the structural unit (I) in the polymer (A) is preferably 5 to 70 mol %, and more preferably 10 to 60 mol %, based on the total structural units included in the polymer (A). If the content of the structural unit (I) is within the above specific range, the lithographic properties of the radiation-sensitive resin composition are improved.

Structural Unit (II)

The structural unit (II) is shown by the formula (2). $R^3$ in the formula (2) represents a hydrogen atom, a fluorine atom, a methyl group, or a trifluoromethyl group, and $R^4$ represents a monovalent non-acid-labile group that has an alicyclic structure and includes a polar group. The term "non-acid-labile group" used herein refers to a group that does not dissociate or relatively hardly dissociates due to an acid generated by the photoacid generator (B) upon exposure.

Examples of the alicyclic structure include a monoalicyclic structure and a polyalicyclic structure. The alicyclic structure is preferably a polyalicyclic structure. Note that the polyalicyclic structure refers to norbornane, tricyclodecane, tetracyclododecane, adamantane, and the like. If the structural unit (II) has a polyalicyclic structure, the carbon content of the developed pattern can be increased, so that excellent heat resistance and etching resistance can be achieved. The polar group is preferably a group that includes an atom having an electronegativity higher than that of a carbon atom. If the polyalicyclic structure has a polar group, the contrast value γ can be adjusted by controlling the dissolution rate of the polymer (A) in the developer. It is considered that the structural unit (II) makes it possible to control the contrast value γ by controlling the dissolution rate of the unexposed area in the developer via a hydrophobic polyalicyclic structure and a hydrophilic polar group.

Specific examples of the polar group include a carbonyl group, a hydroxyl group, a cyano group, a nitro group, a sulfonamide group, and the like. Among these, a carbonyl group, a hydroxyl group, and a cyano group are preferable. The affinity of the polymer (A) to the developer can be adjusted when $R^4$ represents a group that has the above specific structure. This makes it possible to achieve a more appropriate contrast value γ, so that the EL, DOF, CDU, and MEEF can be further improved.
Examples of the structural unit (II) include structural units shown by the following formulas.
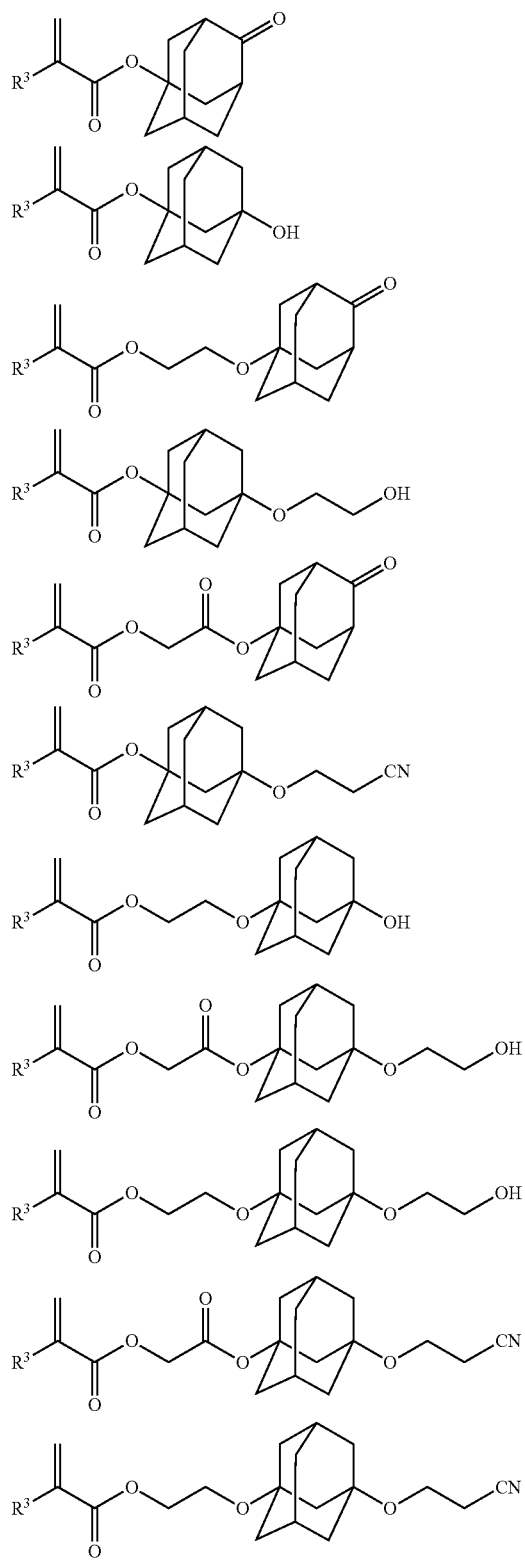
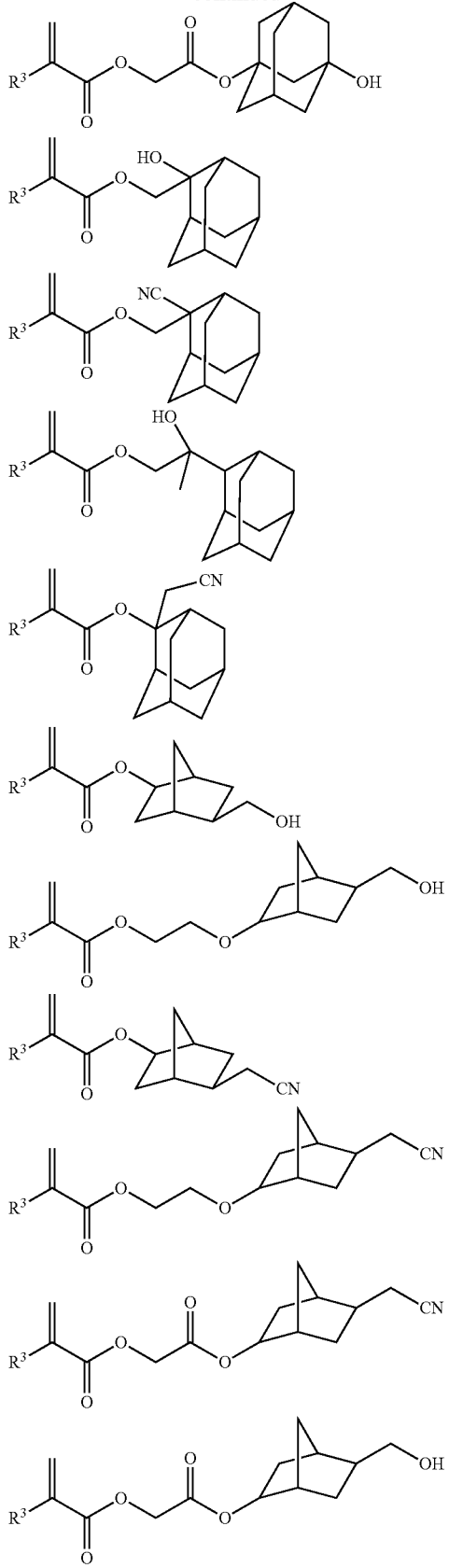
wherein $R^3$ is the same as defined for the formula (2).

The content of the structural unit (II) in the polymer (A) is preferably 1 to 30 mol %, and more preferably 5 to 25 mol %, based on the total structural units included in the polymer (A). The contrast value γ can be controlled within a more desired range by setting the content of the structural unit (II) in the polymer (A) within the above specific range.

Structural Unit (III)

The structural unit (III) includes a lactone-containing group or a cyclic carbonate-containing group. The term "lactone-containing group" used herein refers to a group that includes one ring (lactone ring) that includes a structure shown by —O—C(O)—. The term "cyclic carbonate-containing group" used herein refers to a cyclic group that includes one ring (cyclic carbonate ring) that includes a bond shown by —O—C(O)—O—. A group that includes only one lactone ring or cyclic carbonate ring is referred to as a monocyclic group, and a group that further includes another cyclic structure is referred to as a polycyclic group.

Examples of the structural unit (III) include structural units shown by the following formulas.

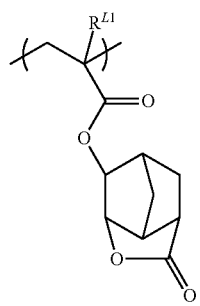
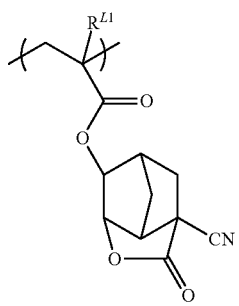
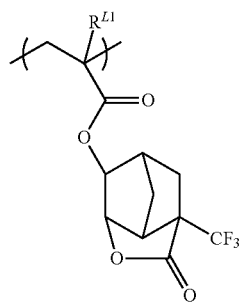
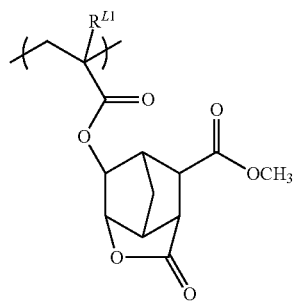

-continued

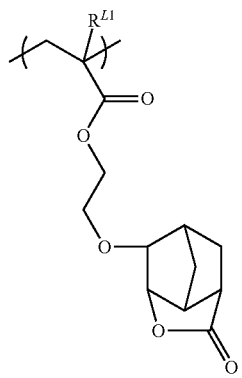
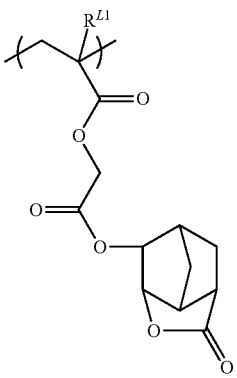
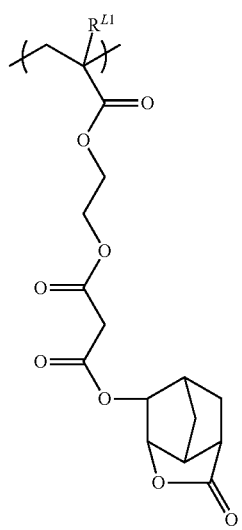
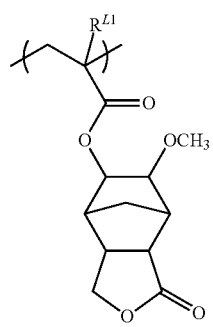
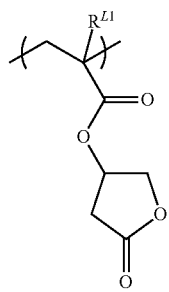
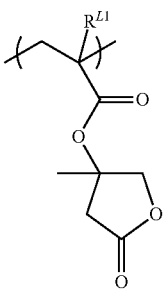
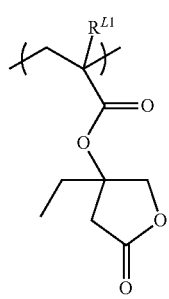
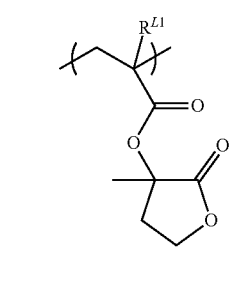

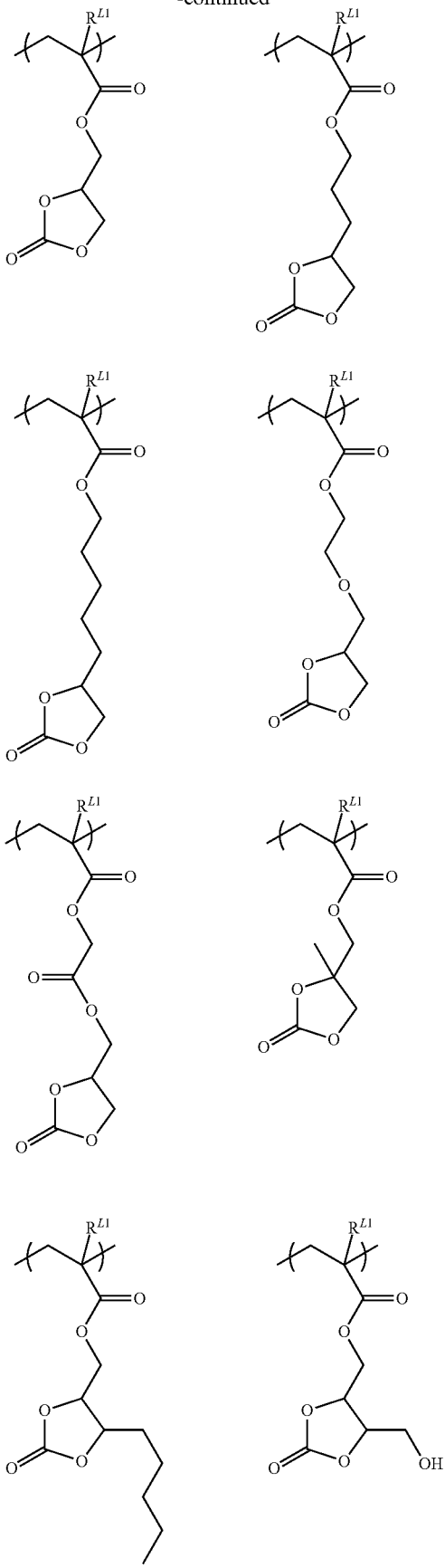
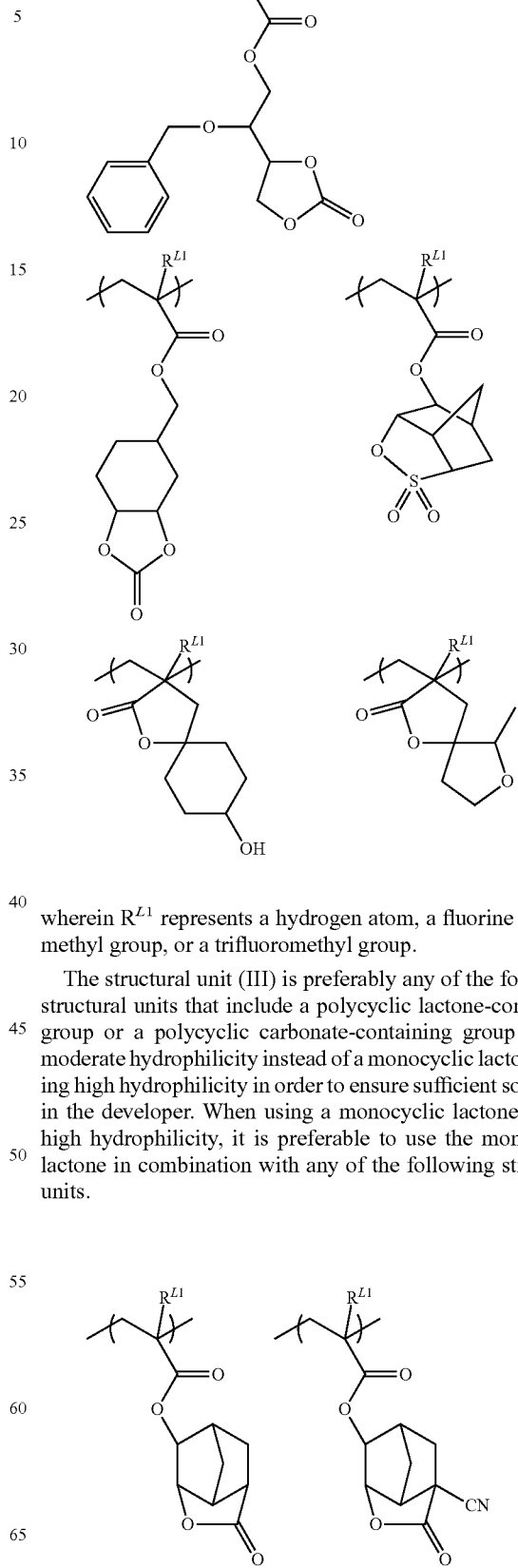

wherein $R^{L1}$ represents a hydrogen atom, a fluorine atom, a methyl group, or a trifluoromethyl group.

The structural unit (III) is preferably any of the following structural units that include a polycyclic lactone-containing group or a polycyclic carbonate-containing group having moderate hydrophilicity instead of a monocyclic lactone having high hydrophilicity in order to ensure sufficient solubility in the developer. When using a monocyclic lactone having high hydrophilicity, it is preferable to use the monocyclic lactone in combination with any of the following structural units.

-continued

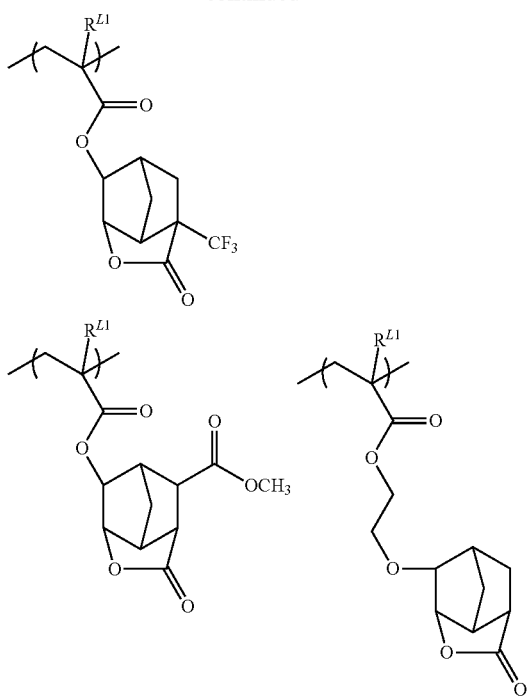

-continued

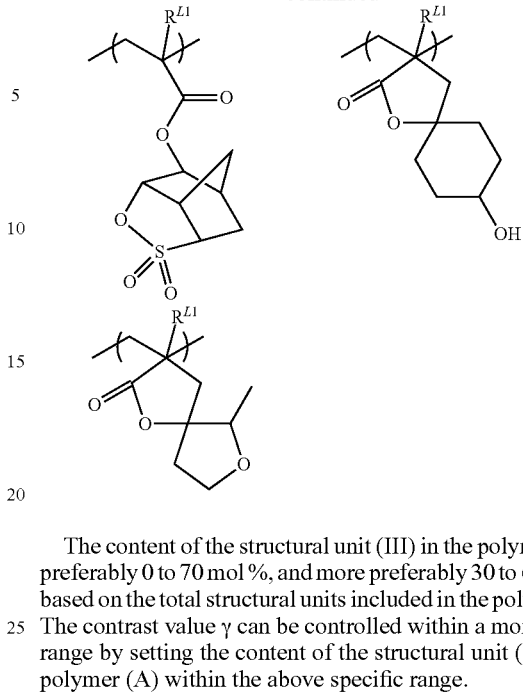

The content of the structural unit (III) in the polymer (A) is preferably 0 to 70 mol %, and more preferably 30 to 60 mol %, based on the total structural units included in the polymer (A). The contrast value γ can be controlled within a more desired range by setting the content of the structural unit (III) in the polymer (A) within the above specific range.

The polymer (A) may further include a structural unit other than the above structural units as long as the effects of the invention are not impaired.

<Synthesis of Polymer (A)>

The polymer (C) may be synthesized by copolymerizing a monomer that produces each structural unit in an appropriate solvent using a radical initiator, for example. The polymer (A) may be synthesized by adding a solution containing a monomer and a radical initiator dropwise to a reaction solvent or a solution containing a monomer to effect polymerization, adding a solution containing a monomer and a solution containing a radical initiator dropwise to a reaction solvent or a solution containing a monomer to effect polymerization, or adding a plurality of solutions respectively containing a monomer and a solution containing a radical initiator dropwise to a reaction solvent or a solution containing a monomer to effect polymerization, for example.

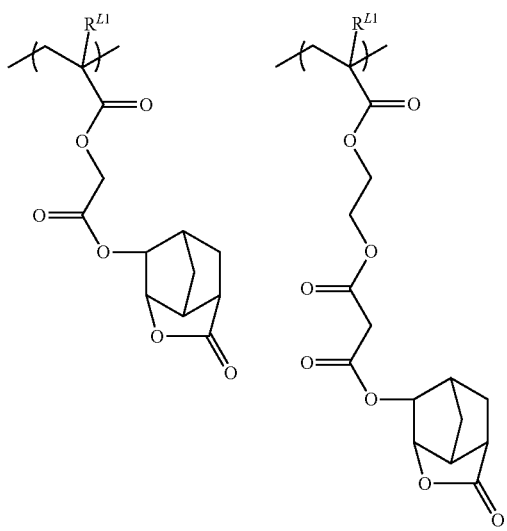

The reaction temperature employed for the above synthesis method may be appropriately determined depending on the type of initiator, but is normally 30 to 180° C., preferably 40 to 160° C., and more preferably 50 to 140° C. The dropwise addition time may be appropriately determined depending on the reaction temperature, the type of initiator, the type of monomer, and the like, but is normally 30 minutes to 8 hours, preferably 45 minutes to 6 hours, and more preferably 1 to 5 hours. The total reaction time including the dropwise addition time may be appropriately determined depending on the reaction temperature, the type of initiator, the type of monomer, and the like, but is normally 30 minutes to 8 hours, preferably 45 minutes to 7 hours, and more preferably 1 to 6 hours.

Examples of the radical initiator used for polymerization include azobisisobutyronitrile, 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis(2-methylpropionitrile), 4,4'-azobis(4-cyanopentanoic acid), and the like. These initiators may be used either individually or in combination.

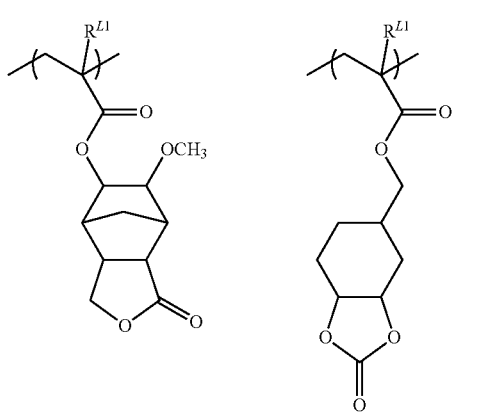

An arbitrary solvent that is other than a solvent that hinders polymerization (e.g., nitrobenzene having a polymerization inhibiting effect or a mercapto compound having a chain transfer effect) and dissolves the monomers may be used as the polymerization solvent. Examples of the polymerization solvent include alcohol solvents, ketone solvents, amide solvents, ester/lactone solvents, nitrile solvents, mixed solvents thereof, and the like. These solvents may be used either individually or in combination.

The polymerization temperature is normally 40 to 150° C., and preferably 50 to 120° C. The polymerization (reaction) time is normally 1 to 48 hours, and preferably 1 to 24 hours.

The polymer obtained by polymerization is preferably collected by re-precipitation. Specifically, the polymer solution is poured into a re-precipitation solvent after completion of polymerization to collect the target polymer as a powder. An alcohol, an alkane, and the like may be used as the re-precipitation solvent either individually or in combination. The polymer may also be collected by removing low-molecular-weight components (e.g., monomer and oligomer) by a separation operation, a column operation, ultrafiltration, or the like.

The polystyrene-reduced weight average molecular weight (Mw) of the polymer (A) determined by gel permeation chromatography (GPC) is preferably 1000 to 100,000, and more preferably 2000 to 50,000. If the Mw of the polymer (A) is less than 1000, the resulting resist film may exhibit insufficient adhesion. If the Mw of the polymer (A) exceeds 100,000, the film formability may deteriorate when forming a resist film.

The ratio Mw/Mn of the Mw to the polystyrene-reduced number average molecular weight (Mn) of the polymer (A) determined by GPC is normally 1 to 5, preferably 1 to 3, and more preferably 1 to 1.60. If the ratio Mw/Mn is within the above range, the dissolution contrast (i.e., the dissolution rate ratio of the exposed area to the unexposed area) increases, so that the EL, DOF, CDU, and MEEF can be more easily controlled.

Note that the terms "Mw" and "Mn" used herein refer to values measured by gel permeation chromatography (GPC) using GPC columns (manufactured by Tosoh Corporation, G2000HXL×2, G3000HXL×1, G4000HXL×1) at a flow rate of 1.0 ml/min and a column temperature of 40° C. (eluant: tetrahydrofuran, standard: monodisperse polystyrene).

<Photoacid Generator (B)>

The radiation-sensitive resin composition includes the photoacid generator (B). The photoacid generator (B) generates an acid upon exposure, and the acid-labile group included in the structural unit (I) included in the polymer (A) dissociates due to the acid generated by the photoacid generator (B). The photoacid generator (B) may be included in the radiation-sensitive resin composition as a compound (described below), or may be included in the polymer.

Examples of the photoacid generator (B) include onium salt compounds, sulfonimide compounds, and the like. It is preferable to use an onium salt compound as the photoacid generator (B).

Examples of the onium salt compounds include sulfonium salts (including tetrahydrothiophenium salts), iodonium salts, and the like.

Examples of the sulfonium salts include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, triphenylphosphonium 1,1,2,2-tetrafluoro-6-(1-adamantanecarbonyloxy)-hexane-1-sulfonate, and the like. Among these, triphenylsulfonium trifluoromethanesulfonate, triphenylsulfonium nonafluoro-n-butanesulfonate, and triphenylphosphonium 1,1,2,2-tetrafluoro-6-(1-adamantanecarbonyloxy)-hexane-1-sulfonate are preferable.

Examples of the tetrahydrothiophenium salts include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl) tetrahydrothiophenium 2-bicyclo[2.2.1]hept-2-yl-1,1,2,2-tetrafluoroethanesulfonate, 1-(6-n-butoxynaphthalen-2-yl) tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl) tetrahydrothiophenium perfluoro-n-octanesulfonate, 1-(6-n-butoxynaphthalen-2-yl)tetrahydrothiophenium 2-bicyclo [2.2.1]hept-2-yl-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, and the like. Among these, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, and 1-(3,5-dimethyl-4-hydroxyphenyl)tetrahydrothiophenium nonafluoro-n-butanesulfonate are preferable.

Examples of the iodonium salts include diphenyliodonium trifluoromethanesulfonate, diphenyliodonium nona fluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl) iodonium trifluoromethanesulfonate, bis(4-t-butylphenyl) iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like. Among these, bis(4-t-butylphenyl)iodonium nonafluoro-n-butanesulfonate is preferable.

These photoacid generators (B) may be used either individually or in combination. The photoacid generator (B) is normally used in an amount of 0.1 to 20 parts by mass, and preferably 0.5 to 15 parts by mass, based on 100 parts by mass of the polymer (A), so that the resulting resist exhibits sufficient sensitivity and developability. If the amount of the photoacid generator (B) is less than 0.5 parts by mass, the sensitivity and the developability may deteriorate. If the amount of the photoacid generator (B) exceeds 20 parts by mass, it may be difficult to obtain a desired resist pattern due to a decrease in transparency to radiation.

<Polymer (C)>

The radiation-sensitive resin composition may include the polymer (C) that has a fluorine atom content higher than that of the polymer (A). When the radiation-sensitive resin composition includes the polymer (C), the polymer (C) tends to be unevenly distributed near the surface of the resulting resist film due to the oil repellency of the polymer (C), so that elution of the photoacid generator (B), the acid diffusion controller (D), and the like into an immersion medium during liquid immersion lithography can be suppressed. It is also possible to control the advancing contact angle of the resist film with the immersion medium within the desired range due to the water repellency of the polymer (C), so that bubble defects can be suppressed. Moreover, since the receding contact angle of the resist film with the immersion medium increases, it is possible to implement high-speed scan exposure (i.e., water droplets do not remain).

The polymer (C) is not particularly limited as long as the polymer (C) includes a fluorine atom, and has a fluorine atom content (mass %) higher than that of the polymer (A). The degree of uneven distribution increases when the polymer (C) has a fluorine atom content higher than that of the polymer (A), so that the properties (e.g., water repellency and elution resistance) of the resulting resist film are improved.

The polymer (C) is produced by polymerizing one or more fluorine atom-containing monomers. Examples of the fluorine atom-containing monomers include compounds including a fluorine atom in the main chain, compounds including a fluorine atom in the side chain, and compounds including a fluorine atom in the main chain and the side chain.

Structural Unit (IV)

The polymer (C) includes a structural unit (IV) shown by the following formula.

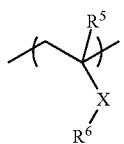

wherein $R^5$ represents a hydrogen atom, a methyl group, or a trifluoromethyl group, X represents a divalent linking group, and $R^6$ represents a linear or branched alkyl group having 1 to 6 carbon atoms that includes at least one fluorine atom, a monovalent alicyclic hydrocarbon group having 4 to 20 carbon atoms, or a derivative thereof.

Examples of the divalent linking group represented by X include a single bond, an oxygen atom, a sulfur atom, a carbonyloxy group, an oxycarbonyl group, an amide group, a sulfonylamide group, a urethane group, and the like.

Examples of a monomer that produces the structural unit (IV) include 2-[1-(ethoxycarbonyl)-1,1-difluorobutyl] (meth)acrylate, trifluoromethyl (meth)acrylate, 2,2,2-trifluoroethyl (meth)acrylate, perfluoroethyl (meth)acrylate, perfluoro-n-propyl (meth)acrylate, perfluoro-1-propyl (meth)acrylate, perfluoro-n-butyl (meth)acrylate, perfluoro-1-butyl (meth)acrylate, perfluoro-t-butyl (meth)acrylate, 2-(1,1,1,3,3,3-hexafluoropropyl) (meth)acrylate, 1-(2,2,3,3,4,4,5,5-octafluoropentyl) (meth)acrylate, perfluorocyclohexylmethyl (meth)acrylate, 1-(2,2,3,3,3-pentafluoropropyl)(meth)acrylate, 1-(3,3,4,4,5,5,6,6,7,7,8,8,9,9,10,10,10-heptadecafluorodecyl)(meth)acrylate, 1-(5-trifluoromethyl-3,3,4,4,5,6,6,6-octafluorohexyl)(meth)acrylate, and the like.

The polymer (C) may include two or more types of structural unit (IV). The content of the structural unit (IV) in the polymer (C) is normally 5 mol % or more, preferably 10 mol % or more, and more preferably 15 mol % or more, based on the total structural units included in the polymer (C). If the content of the structural unit (IV) is less than 5 mol %, a receding contact angle of 70° or more may not be achieved, or elution of the photoacid generator and the like from the resist film may not be suppressed.

Additional Structural Unit

The polymer (C) may further include one or more additional structural units such as a structural unit that includes an acid-labile group, a structural unit that includes a lactone skeleton-containing group or a carbonate-containing group, and a structural unit derived from an aromatic compound, in order to control the dissolution rate in the developer.

Examples of the structural unit that includes an acid-labile group include the structural units mentioned above in connection with the structural unit (I) included in the polymer (A). Examples of the structural unit that includes a lactone skeleton-containing group or a carbonate-containing group include the structural units mentioned above in connection with the structural unit (III) included in the polymer (A).

Examples of a monomer that produces the structural unit derived from an aromatic compound include styrene, α-methylstyrene, 2-methylstyrene, 3-methylstyrene, 4-methylstyrene, 2-methoxystyrene, 3-methoxystyrene, 4-methoxystyrene, 4-(2-t-butoxycarbonylethyloxy)styrene, 2-hydroxystyrene, 3-hydroxystyrene, 4-hydroxystyrene, 2-hydroxy-α-methylstyrene, 3-hydroxy-α-methylstyrene, 4-hydroxy-α-methylstyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, 2,4,6-trihydroxystyrene, 4-t-butoxystyrene, 4-t-butoxy-α-methylstyrene, 4-(2-ethyl-2-propoxy) styrene, 4-(2-ethyl-2-propoxy)-α-methylstyrene, 4-(1-ethoxyethoxy)styrene, 4-(1-ethoxyethoxy)-α-methylstyrene, phenyl (meth)acrylate, benzyl (meth)acrylate, acenaphthylene, 5-hydroxyacenaphthylene, 1-vinylnaphthalene, 2-vinylnaphthalene, 2-hydroxy-6-vinylnaphthalene, 1-naphthyl (meth)acrylate, 2-naphthyl (meth)acrylate, 1-naphthylmethyl (meth)acrylate, 1-anthryl (meth)acrylate, 2-anthryl (meth)acrylate, 9-anthryl (meth)acrylate, 9-anthrylmethyl (meth)acrylate, 1-vinylpyrene, and the like.

The content of the additional structural units in the polymer (C) is normally 80 mol % or less, preferably 75 mol % or less, and more preferably 70 mol % or less, based on the total structural units included in the polymer (C).

The Mw of the polymer (C) is preferably 1000 to 50,000, more preferably 1000 to 30,000, and particularly preferably 1000 to 10,000. If the Mw of the polymer (C) is less than 1000, a sufficient receding contact angle may not be obtained. If the Mw of the polymer (C) exceeds 50,000, the resulting resist may exhibit low developability. The ratio Mw/Mn of the Mw to the Mn of the polymer (C) is normally 1 to 3, and preferably 1 to 2.

The polymer (C) is preferably used in the radiation-sensitive resin composition in an amount of 0 to 50 parts by mass, more preferably 0 to 20 parts by mass, and particularly preferably 0.5 to 10 parts by mass, based on 100 parts by mass of the polymer (A). If the amount of the polymer (C) in the radiation-sensitive resin composition is within the above specific range, the water repellency and the elution resistance of the surface of the resulting resist film can be further improved.

<Synthesis of Polymer (C)>

The polymer (C) may be synthesized by polymerizing a monomer that produces each structural unit in an appropriate solvent using a radical initiator, for example. Examples of the radical initiator and the solvent include those mentioned above in connection with synthesis of the polymer (A). The polymerization temperature is normally 40 to 150° C., and preferably 50 to 120° C. The polymerization time is normally 1 to 48 hours, and preferably 1 to 24 hours.

<Acid Diffusion Controller (D)>

The acid diffusion controller (D) controls a phenomenon in which an acid generated by the photoacid generator (B) upon exposure is diffused in the resist film, and suppresses undesired chemical reactions in the unexposed area. The acid diffusion controller (D) may be included in the radiation-sensitive resin composition as a compound (described below), or may be included in the polymer.

Examples of the acid diffusion controller (D) include amine compounds, amide group-containing compounds, urea compounds, nitrogen-containing heterocyclic compounds, and the like.

Examples of the amine compounds include mono(cyclo)alkylamines, di(cyclo)alkylamines, tri(cyclo)alkylamines, substituted-alkylanilines or derivatives thereof, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolizinone, 2-quinoxalinol, N,N,N',N'-tetrakis(2-hydroxypropyl)ethylenediamine, N,N,N',N'',N''-pentamethyldiethylenetriamine, and the like.

Examples of the amide group-containing compounds include N-t-butoxycarbonyl group-containing amino compounds, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compounds include imidazoles, pyridines, piperazines, pyrazine, pyrazole, pyridazine, quinoxaline, purine, pyrrolidine, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

A photodegradable base that generates a weak acid upon exposure may also be used as the acid diffusion controller (D). Examples of the photodegradable base include onium salt compounds that lose acid-diffusion controllability upon decomposition due to exposure. Examples of the onium salt compounds include sulfonium salt compounds shown by the following formula (K1), iodonium salt compounds shown by the following formula (K2), and the like.

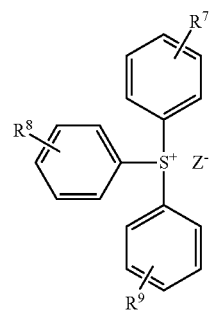

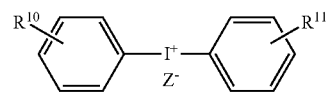

wherein $R^7$ to $R^{11}$ individually represent a hydrogen atom, an alkyl group, an alkoxy group, a hydroxyl group, or a halogen atom, $Z^-$ represents $OH^-$, $R^4-COO^-$, or $R^4-SO_3^-$, and $R^4$ represents an alkyl group, an aryl group, an alkaryl group, or an anion shown by the following formula.

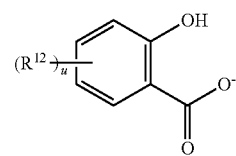

wherein $R^{12}$ represents a linear or branched alkyl group having 1 to 12 carbon atoms or a linear or branched alkoxy group having 1 to 12 carbon atoms, provided that some or all of the hydrogen atoms of the alkyl group or the alkoxy group may be substituted with a fluorine atom, and u is an integer from 0 to 2, provided that a plurality of $R^{12}$ may be either the same or different when n is 2.

These acid diffusion controllers (D) may be used either individually or in combination. The acid diffusion controller (D) is preferably used in an amount of less than 15 parts by mass based on 100 parts by mass of the polymer (A). If the amount of the acid diffusion controller (D) exceeds 15 parts by mass, the sensitivity of the resulting resist may deteriorate.

<Solvent (E)>

The radiation-sensitive resin composition normally includes the solvent (E). Examples of the solvent (E) include alcohol solvents, ketone solvents, amide solvents, ether solvents, ester solvents, and the like. These solvents may be used either individually or in combination.

Examples of the alcohol solvents include monohydric alcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol;

polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethyl butyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropyleneglycol monomethylether, dipropylene glycol monoethyl ether, and dipropylene glycol monopropyl ether; and the like.

Examples of the ketone solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonane, cyclopentanone, cyclohexanone, cycloheptanone, cyclooctanone, methylcyclohexanone, 2,4-pentanedione, acetonylacetone, diacetone alcohol, acetophenone, and the like.

Examples of the amide solvents include N,N'-dimethylimidazolidinone, N-methylformamide, N,N-dimethylformamide, N,N-dimethylformamide, acetamide, N-methylacetamide, N,N-dimethylacetamide, N-methylpropioneamide, N-methylpyrrolidone, and the like.

Examples of the ester solvents include diethyl carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of further solvents include aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, and n-amylnaphthalene; halogen-containing solvents such as dichloromethane, chloroform, fluorocarbon, chlorobenzene, and dichlorobenzene; and the like.

Among these, propylene glycol monomethyl ether acetate, propylene glycol monomethyl ether, ethyl lactate, cyclohexanone, and γ-butyrolactone are preferable.

<Additional Optional Components>

The radiation-sensitive resin composition may further include an additional optional component (e.g., surfactant, alicyclic skeleton-containing compound, or sensitizer) in addition to the components (A) to (E) as long as the effects of the invention are not impaired. The radiation-sensitive resin composition may include two or more types of each additional optional component. The content of each additional optional component may be appropriately determined depending on the objective. Each additional optional component is described in detail below.

Surfactant

The surfactant improves the applicability, striation, developability, and the like of the radiation-sensitive resin composition. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard BG710, Surflon S-382, Surflon SC-101, Surflon SC-102, Surflon SC-103, Surflon SC-104, Surflon SC-105, Surflon SC-106 (manufactured by Asahi Glass Co., Ltd.); and the like.

Alicyclic Skeleton-Containing Compound

The alicyclic skeleton-containing compound improves the dry etching resistance, the pattern shape, adhesion to a substrate, and the like. Examples of the alicyclic skeleton-containing compound include adamantane derivatives such as 1-adamantanecarboxylic acid, 2-adamantanone, and t-butyl 1-adamantanecarboxylate, deoxycholates such as t-butyl deoxycholate, t-butoxycarbonylmethyl deoxycholate, and 2-ethoxyethyl deoxycholate, lithocholates such as t-butyl lithocholate, t-butoxycarbonylmethyl lithocholate, and 2-ethoxyethyl lithocholate, 3-[2-hydroxy-2,2-bis(trifluoromethyl)ethyl]tetracyclo[4.4.0.1$^{2,5}$.1$^{7,10}$]dodecane, 2-hydroxy-9-methoxycarbonyl-5-oxo-4-oxatricyclo[4.2.1.0$^{3,7}$]nonane, and the like.

Sensitizer

The sensitizer increases the amount of acid generated by the photoacid generator (B), and improves the apparent sensitivity of the radiation-sensitive resin composition. Examples of the sensitizer include carbazoles, acetophenones, benzophenones, naphthalenes, phenols, biacetyl, eosine, rose bengal, pyrenes, anthracenes, phenothiazines, and the like.

<Production of Radiation-Sensitive Resin Composition>

The radiation-sensitive resin composition may be produced by mixing the polymer (A), the photoacid generator (B), the polymer (C), the acid diffusion controller (D), and an additional optional component in the solvent (E) in a given ratio, for example. The radiation-sensitive resin composition is normally produced by dissolving the components in the solvent so that the total solid content is 1 to 30 mass %, and preferably 1.5 to 25 mass %, and filtering the solution through a filter having a pore size of about 200 nm, for example.

<Resist Pattern-Forming Method>

A resist pattern-forming method using the radiation-sensitive resin composition includes (1) a resist film-forming step, (2) an exposure step, and (3) a development step. Each step is described in detail below.

Resist Film-Forming Step (1)

In the resist film-forming step (1), the radiation-sensitive resin composition is applied to a substrate to form a resist film. A silicon wafer, an aluminum-coated wafer, or the like may be used as the substrate. An organic or inorganic antireflective film as disclosed in Japanese Patent Publication (KOKOKU) No. 6-12452, Japanese Patent Application Publication (KOKAI) No. 59-93448, or the like may be formed on the substrate.

The radiation-sensitive resin composition may be applied by spin coating, cast coating, roll coating, or the like. The thickness of the resist film is normally 0.01 to 1 µm, and preferably 0.01 to 0.5 µm.

The resist film formed by applying the radiation-sensitive resin composition may optionally be prebaked (PB) to vaporize the solvent from the film. The PB temperature is appropriately selected depending on the composition of the radiation-sensitive resin composition, but is normally about 30 to about 200° C., and preferably 50 to 150° C.

A protective film as disclosed in Japanese Patent Application Publication (KOKAI) No. 5-188598 or the like may be formed on the resist layer in order to prevent the effects of basic impurities and the like contained in the environmental atmosphere. In order to prevent outflow of the photoacid generator (B) and the like from the resist layer, a liquid immersion lithography protective film as disclosed in Japanese Patent Application Publication (KOKAI) No. 2005-352384 or the like may be formed on the resist film. These techniques may be used in combination.

Exposure Step (2)

In the exposure step (2), the desired area of the resist film formed by the resist film-forming step is subjected to reduced projection exposure via a mask having a specific pattern and an optional immersion liquid. For example, the desired area of the resist film may be subjected to reduced projection exposure via an isolated line pattern mask to form an isolated trench pattern. The resist film may be exposed a plurality of times using the desired pattern mask and another pattern mask. Examples of the immersion liquid used for exposure include water, a fluorine-containing inert liquid, and the like. It is preferable that the immersion liquid be transparent to the exposure wavelength, and has a temperature coefficient of the refractive index as small as possible so that distortion of an optical image projected onto the film is minimized. When using an ArF excimer laser (wavelength: 193 nm) as the exposure light, it is preferable to use water from the viewpoint of availability and ease of handling. When using water as the immersion liquid, a small amount of an additive that decreases the surface tension of water and increases the surface activity of water may be added to the water. It is preferable that the additive does not dissolve the resist layer formed on the wafer, and does not affect the optical coating of the bottom surface of the lens. Distilled water is preferably used as the water.

Radiation used for exposure is appropriately selected from ultraviolet rays, deep ultraviolet rays, X-rays, charged particle rays, and the like depending on the type of photoacid generator (B). It is preferable to use deep ultraviolet rays such as ArF excimer laser light or KrF excimer laser light (wavelength: 248 nm). It is more preferable to use ArF excimer laser light. The exposure conditions (e.g., dose) are appropriately selected depending on the composition of the radiation-sensitive resin composition, the type of additive, and the like. The pattern-forming method may include a plurality of exposure steps. An identical or different light source may be used in each exposure step. Note that it is preferable to use ArF excimer laser light in the first exposure step.

It is preferable to perform post-exposure bake (PEB) after exposure. The acid-labile group included in the radiation-sensitive resin composition dissociates smoothly due to PEB. The PEB temperature is normally 30 to 200° C., and preferably 50 to 170° C.

Development Step (3)

In the development step (3), the resist film subjected to the exposure step is developed using a developer to form a resist pattern. The developer is preferably at least one organic solvent selected from the group consisting of alkyl carboxylates having 3 to 7 carbon atoms and dialkyl ketones having 3 to 10 carbon atoms. The contrast value γ of the radiation-sensitive resin composition can be controlled within a more desired range by utilizing the above specific organic solvent as the developer.

Examples of the alkyl carboxylates having 3 to 7 carbon atoms include diethyl carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, and the like.

Examples of the dialkyl ketones having 3 to 10 carbon atoms include acetone, 2-butanone, methyl amyl ketone, methyl n-propyl ketone, methyl n-butyl ketone, diethyl ketone, methyl isobutyl ketone, methyl n-pentyl ketone, ethyl n-butyl ketone, and the like.

Among these, n-butyl acetate and methyl amyl ketone are preferable. These organic solvents may be used either individually or in combination.

Examples of the development method include a dipping method that immerses the substrate in a container filled with the developer for a given time, a puddle method that allows the developer to be present on the surface of the substrate due to surface tension for a given time, a spray method that sprays the developer onto the surface of the substrate, a dynamic dispensing method that applies the developer to the substrate that is rotated at a constant speed while scanning with a developer application nozzle at a constant speed, and the like.

It is preferable to rinse the resist film with a rinse agent after the development step (3). An organic solvent may be used as the rinse agent so that scum can be efficiently washed away. A hydrocarbon solvent, a ketone solvent, an ester solvent, an alcohol solvent, an amide solvent, or the like is preferable as the rinse agent. Among these, an alcohol solvent and an ester solvent are preferable, and a monohydric alcohol solvent having 6 to 8 carbon atoms is particularly preferable.

Examples of the monohydric alcohol solvent having 6 to 8 carbon atoms include linear, branched, or cyclic monohydric alcohols such as 1-hexanol, 1-heptanol, 1-octanol, 4-methyl-2-pentanol, 2-hexanol, 2-heptanol, 2-octanol, 3-hexanol, 3-heptanol, 3-octanol, 4-octanol, and benzyl alcohol. Among these, 1-hexanol, 2-hexanol, 2-heptanol, and 4-methyl-2-pentanol are preferable.

The rinse agent may include one or more types of each component. The water content in the rinse agent is preferably 10 mass % or less, more preferably 5 mass % or less, and still more preferably 3 mass % or less. If the water content in the rinse agent is 10 mass % or less, excellent developability can be obtained. Note that a surfactant may be added to the rinse agent. Examples of the rinse method include a spin method that applies the rinse agent to the substrate that is rotated at a constant speed, a dipping method that immerses the substrate in a container filled with the rinse agent for a given time, a spray method that sprays the rinse agent onto the surface of the substrate, and the like.

EXAMPLES

The invention is further described below by way of examples. Note that the invention is not limited to the following examples. Note that the polymer was subjected to $^{13}$C-NMR analysis using a nuclear magnetic resonance spectrometer ("JNM-EX270" manufactured by JEOL Ltd.).
The structure of each monomer used to synthesize the polymers (A) and (C) is shown below.
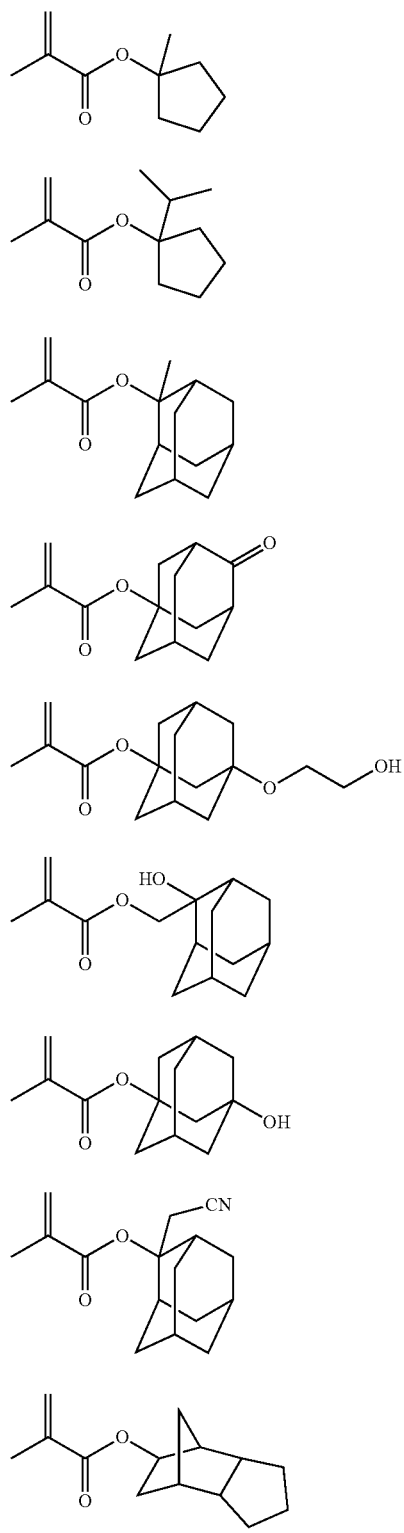
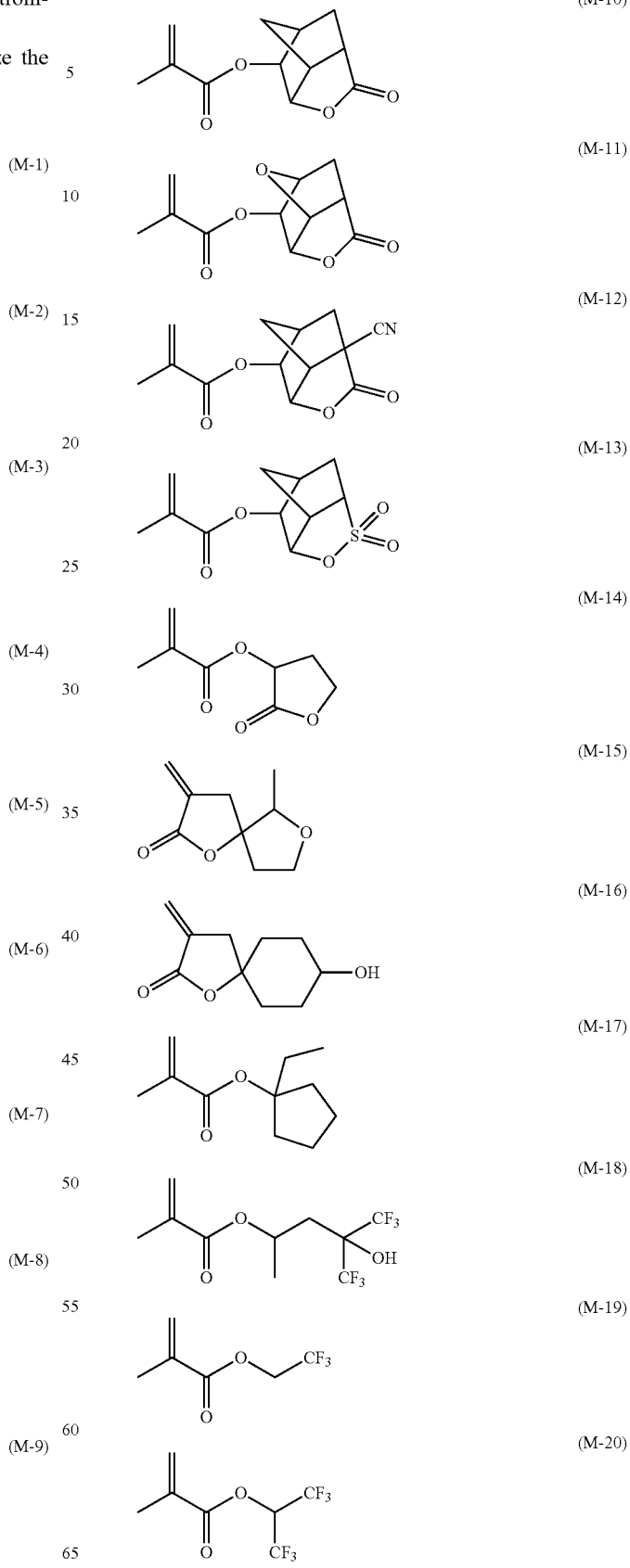

Synthesis of Polymer (A)

Synthesis Example 1

7.3 g (30 mol %) of the monomer (M-1) that produces the structural unit (I), 6.7 g (20 mol %) of the monomer (M-4) that produces the structural unit (II), and 16.0 g (50 mol %) of the monomer (M-10) that produces the structural unit (III) were dissolved in 60 g of 2-butanone, and 0.5 g (2 mol %) of azobisisobutyronitrile (initiator) was added to the solution to prepare a monomer solution. A three-necked flask (200 ml) charged with 30 g of 2-butanone was purged with nitrogen for 30 minutes, and heated to 80° C. with stirring. The monomer solution was added dropwise to the flask using a dropping funnel over 3 hours. The monomers were polymerized for 6 hours from the start of addition of the monomer solution. After completion of polymerization, the polymer solution was cooled with water to 30° C. or less, and poured into 600 g of methanol. A white powder that precipitated by this operation was collected by filtration. The white powder thus collected was washed twice with 150 g of methanol in a slurry state, collected again by filtration, and dried at 50° C. for 17 hours to obtain a white powdery polymer (A-1). The polymer (A-1) had an Mw of 13,400 and a ratio Mw/Mn of 1.58. As a result of $^{13}$C-NMR analysis, it was found that the content of the structural unit (I), the content of the structural unit (II), and the content of the structural unit (III) in the polymer (A-1) were 29 mol %, 20 mol %, and 51 mol %, respectively.

Synthesis Examples 2 to 10 and 12 to 18

A polymer was produced in the same manner as in Synthesis Example 1, except for changing the types and the amounts of monomers as shown in Table 1. Table 1 also shows the content of each structural unit and the Mw and the ratio Mw/Mn of the resulting polymer. The symbol "-" in Table 1 indicates that the corresponding structural unit was not present.

Synthesis Example 11

A polymer (A-11) was produced in the same manner as in Synthesis Example 1, except for using 0.8 g (2 mol %) of "V-501" (manufactured by Wako Pure Chemical Industries, Ltd.) as the initiator.

TABLE 1

| | Polymer (A) | Monomer Type | Amount (mol %) | Structural unit (I) Type | mol % | Structural unit (II) Type | mol % | Structural unit (III) Type | mol % | Mw | Mw/Mn |
|---|---|---|---|---|---|---|---|---|---|---|---|
| Synthesis Example 1 | A-1 | M-1<br>M-4<br>M-10 | 30<br>20<br>50 | M-1 | 29 | M-4 | 20 | M-10 | 51 | 13,400 | 1.58 |
| Synthesis Example 2 | A-2 | M-1<br>M-5<br>M-10 | 40<br>10<br>50 | M-1 | 39 | M-5 | 10 | M-10 | 51 | 13,100 | 1.52 |
| Synthesis Example 3 | A-3 | M-1<br>M-6<br>M-10 | 40<br>10<br>50 | M-1 | 40 | M-6 | 10 | M-10 | 50 | 12,900 | 1.54 |
| Synthesis Example 4 | A-4 | M-1<br>M-8<br>M-10 | 40<br>10<br>50 | M-1 | 39 | M-8 | 10 | M-10 | 51 | 13,200 | 1.55 |
| Synthesis Example 5 | A-5 | M-2<br>M-4<br>M-10 | 30<br>20<br>50 | M-2 | 30 | M-4 | 20 | M-10 | 50 | 13,000 | 1.49 |
| Synthesis Example 6 | A-6 | M-2<br>M-5<br>M-10 | 40<br>10<br>50 | M-2 | 41 | M-5 | 10 | M-10 | 50 | 13,100 | 1.54 |
| Synthesis Example 7 | A-7 | M-3<br>M-4<br>M-10 | 30<br>20<br>50 | M-3 | 29 | M-4 | 20 | M-10 | 51 | 13,300 | 1.52 |
| Synthesis Example 8 | A-8 | M-1<br>M-10 | 50<br>50 | M-1 | 49 | — | — | M-10 | 51 | 13,000 | 1.56 |
| Synthesis Example 9 | A-9 | M-1<br>M-9<br>M-10 | 40<br>10<br>50 | M-1 | 40 | M-9 | 10 | M-10 | 50 | 12,900 | 1.50 |
| Synthesis Example 10 | A-10 | M-1<br>M-4<br>M-10 | 20<br>40<br>40 | M-1 | 21 | M-4 | 40 | M-10 | 39 | 13,000 | 1.55 |
| Synthesis Example 11 | A-11 | M-1<br>M-4<br>M-10 | 50<br>10<br>40 | M-1 | 50 | M-4 | 10 | M-10 | 40 | 13,100 | 1.51 |
| Synthesis Example 12 | A-12 | M-2<br>M-4<br>M-10<br>M-11 | 40<br>10<br>40<br>10 | M-2 | 40 | M-4 | 10 | M-10<br>M-11 | 10<br>10 | 12,800 | 1.55 |
| Synthesis Example 13 | A-13 | M-2<br>M-7<br>M-12 | 50<br>10<br>40 | M-2 | 48 | M-7 | 11 | M-12 | 39 | 13,200 | 1.54 |
| Synthesis Example 14 | A-14 | M-1<br>M-3<br>M-7<br>M-13 | 30<br>20<br>10<br>40 | M-1 | 30 | M-3 | 20 | M-7<br>M-13 | 10<br>40 | 12,900 | 1.49 |

TABLE 1-continued

| | Polymer (A) | Monomer Type | Amount (mol %) | Structural unit (I) Type | mol % | Structural unit (II) Type | mol % | Structural unit (III) Type | mol % | Mw | Mw/Mn |
|---|---|---|---|---|---|---|---|---|---|---|---|
| Synthesis Example 15 | A-15 | M-3 | 40 | M-3 | 40 | M-8 | 20 | M-10 | 20 | 12,600 | 1.51 |
| | | M-8 | 20 | | | | | | | | |
| | | M-10 | 20 | | | | | M-14 | 20 | | |
| | | M-14 | 20 | | | | | | | | |
| Synthesis Example 16 | A-16 | M-3 | 40 | M-3 | 40 | M-5 | 20 | M-11 | 30 | 13,100 | 1.50 |
| | | M-5 | 20 | | | | | | | | |
| | | M-11 | 30 | | | | | M-15 | 10 | | |
| | | M-15 | 10 | | | | | | | | |
| Synthesis Example 17 | A-17 | M-3 | 40 | M-3 | 40 | M-7 | 10 | M-12 | 40 | 12,800 | 1.51 |
| | | M-7 | 10 | | | | | | | | |
| | | M-12 | 40 | | | | | M-16 | 10 | | |
| | | M-16 | 10 | | | | | | | | |
| Synthesis Example 18 | A-18 | M-3 | 40 | M-3 | 40 | M-8 | 20 | M-14 | 40 | 12,600 | 1.51 |
| | | M-8 | 20 | | | | | | | | |
| | | M-14 | 40 | | | | | | | | |

Synthesis of Polymer (C)

Synthesis Example 19

35.8 g (70 mol %) of the monomer (M-17) that produces the additional structural unit and 14.2 g (30 mol %) of the monomer (M-19) that produces the structural unit (IV) were dissolved in 100 g of 2-butanone, and 5.17 g of dimethyl 2.2'-azobisisobutyrate (initiator) was added to the solution to prepare a monomer solution. A three-necked flask (500 ml) charged with 50 g of 2-butanone was purged with nitrogen for 30 minutes, and heated to 80° C. with stirring. The monomer solution was added dropwise to the flask using a dropping funnel over 3 hours. The monomers were polymerized for 6 hours from the start of addition of the monomer solution. After completion of polymerization, the solution was cooled with water to 30° C. or less, transferred to a 2 l separating funnel, and homogeneously diluted with 150 g of n-hexane. After the addition of 600 g of methanol, the components were mixed. After the addition of 30 g of distilled water, the mixture was stirred, and allowed to stand for 30 minutes. The lower layer was then collected, and dissolved in propylene glycol monomethyl ether acetate to obtain a propylene glycol monomethyl ether acetate solution containing a polymer (C-1). The polymer (C-1) had an Mw of 7000 and a ratio Mw/Mn of 1.60.

Synthesis Example 20

32.6 g (60 mol %) of the monomer (M-18) that produces the additional structural unit and 17.4 g (40 mol %) of the monomer (M-20) that produces the structural unit (IV) were dissolved in 100 g of 2-butanone, and 3.40 g of dimethyl 2.2'-azobisisobutyrate (initiator) was added to the solution to prepare a monomer solution. A three-necked flask (500 ml) charged with 50 g of 2-butanone was purged with nitrogen for 30 minutes, and heated to 80° C. with stirring. The monomer solution was added dropwise to the flask using a dropping funnel over 3 hours. The monomers were polymerized for 6 hours from the start of addition of the monomer solution. After completion of polymerization, the solution was cooled with water to 30° C. or less, transferred to a 2 l separating funnel, and homogeneously diluted with 150 g of n-hexane. After the addition of 600 g of methanol, the components were mixed. After the addition of 30 g of distilled water, the mixture was stirred, and allowed to stand for 30 minutes. The lower layer was then collected, and dissolved in propylene glycol monomethyl ether acetate to obtain a propylene glycol monomethyl ether acetate solution containing a polymer (C-2). The polymer (C-2) had an Mw of 7200 and a ratio Mw/Mn of 1.59.

<Production of Radiation-Sensitive Resin Composition>

The following photoacid generators (B) and acid diffusion controllers (D) were used to produce each radiation-sensitive resin composition.

<Photoacid Generator (B)>

B-1: compound shown by the following formula (B-1)

B-2: compound shown by the following formula (B-2)

B-3: compound shown by the following formula (B-3)

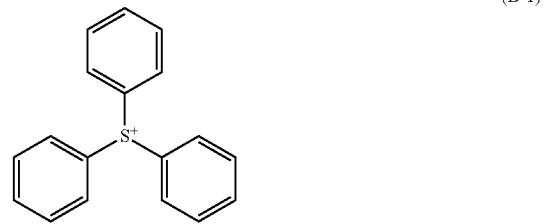

(B-1)

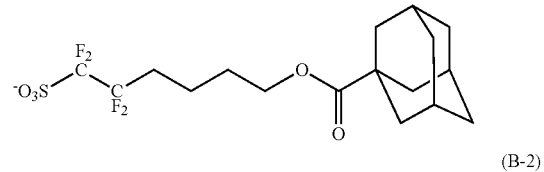

(B-2)

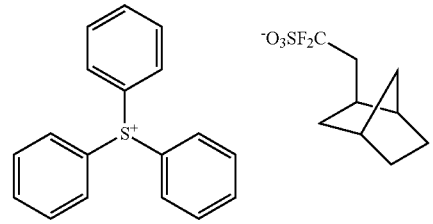

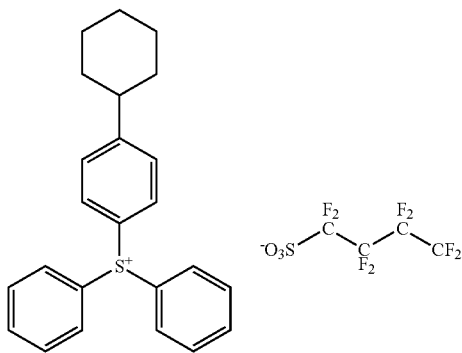

Acid Diffusion Controller (D)

D-1: compound shown by the following formula (D-1)
D-2: compound shown by the following formula (D-2)
D-3: compound shown by the following formula (D-3)

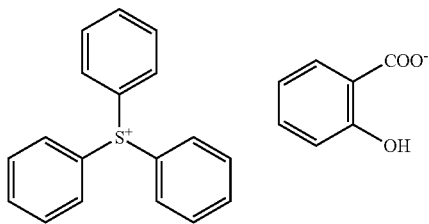

(D-1)

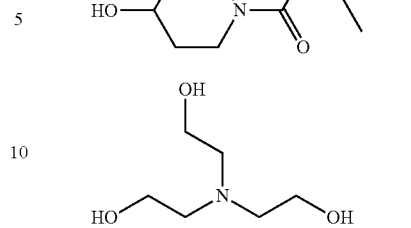

(D-2)

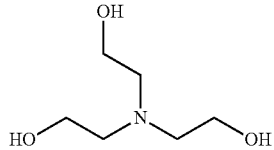

(D-3)

Solvent (E)

E-1: propylene glycol monomethyl ether acetate
E-2: cyclohexanone
E-3: γ-butyrolactone Example 1

100 parts by mass of the polymer (A-1) (polymer (A)), 10.8 parts by mass of the photoacid generator (B-1) (photoacid generator (B)), 3 parts by mass of the polymer (C-1) (polymer (C)), 4.5 parts by mass of the acid diffusion controller (D-1) (acid diffusion controller (D)), 1972 parts by mass of the solvent (E-1) (solvent (E)), 845 parts by mass of the solvent (E-2) (solvent (E)), and 30 parts by mass of the solvent (E-3) (solvent (E)) were mixed to obtain a homogeneous solution. The solution was filtered through a membrane filter having a pore size of 200 nm to obtain a radiation-sensitive resin composition.

Examples 2 to 24 and Comparative Examples 1 to 7

A radiation-sensitive resin composition was produced in the same manner as in Example 1, except for changing the types and the amounts of components as shown in Table 2.

TABLE 2

| | Polymer (A) | | Photoacid generator (B) | | Polymer (C) | | Acid diffusion controller (D) | | Solvent (E) | |
|---|---|---|---|---|---|---|---|---|---|---|
| | Type | Amount (parts by mass) | Type | Amount (parts by mass) | Type | Amount (parts by mass) | Type | Amount (parts by mass) | Type | Amount (parts by mass) |
| Example 1 | A-1 | 100 | B-1 | 10.8 | C-1 | 3 | D-1 | 4.5 | E-1/E-2/E-3 | 1,972/845/30 |
| Example 2 | A-1 | 100 | B-1 | 12.1 | C-1 | 3 | D-2 | 1.7 | E-1/E-2/E-3 | 1,953/837/30 |
| Example 3 | A-2 | 100 | B-1 | 10.8 | C-1 | 3 | D-1 | 4.5 | E-1/E-2/E-3 | 1,972/845/30 |
| Example 4 | A-2 | 100 | B-1 | 12.1 | C-1 | 3 | D-2 | 1.7 | E-1/E-2/E-3 | 1,953/837/30 |
| Example 5 | A-3 | 100 | B-1 | 10.8 | C-1 | 3 | D-1 | 4.5 | E-1/E-2/E-3 | 1,972/845/30 |
| Example 6 | A-3 | 100 | B-1 | 12.1 | C-1 | 3 | D-2 | 1.7 | E-1/E-2/E-3 | 1,953/837/30 |
| Example 7 | A-4 | 100 | B-1 | 10.8 | C-1 | 3 | D-1 | 4.5 | E-1/E-2/E-3 | 1,972/845/30 |
| Example 8 | A-4 | 100 | B-1 | 12.1 | C-1 | 3 | D-2 | 1.7 | E-1/E-2/E-3 | 1,953/837/30 |
| Example 9 | A-5 | 100 | B-1 | 10.8 | C-1 | 3 | D-1 | 4.5 | E-1/E-2/E-3 | 1,972/845/30 |
| Example 10 | A-5 | 100 | B-1 | 12.1 | C-1 | 3 | D-2 | 1.7 | E-1/E-2/E-3 | 1,953/837/30 |
| Example 11 | A-6 | 100 | B-1 | 10.8 | C-1 | 3 | D-1 | 4.5 | E-1/E-2/E-3 | 1,972/845/30 |
| Example 12 | A-6 | 100 | B-1 | 12.1 | C-1 | 3 | D-2 | 1.7 | E-1/E-2/E-3 | 1,953/837/30 |
| Example 13 | A-7 | 100 | B-1 | 10.8 | C-1 | 3 | D-1 | 4.5 | E-1/E-2/E-3 | 1,972/845/30 |
| Example 14 | A-7 | 100 | B-1 | 12.1 | C-1 | 3 | D-2 | 1.7 | E-1/E-2/E-3 | 1,953/837/30 |
| Example 15 | A-11 | 100 | B-1 | 10.8 | C-1 | 3 | D-1 | 4.5 | E-1/E-2/E-3 | 1,972/845/30 |
| Example 16 | A-11 | 100 | B-1 | 12.1 | C-1 | 3 | D-2 | 1.7 | E-1/E-2/E-3 | 1,953/837/30 |
| Example 17 | A-12 | 100 | B-2 | 11.5 | C-1 | 3 | D-3 | 1.7 | E-1/E-2/E-3 | 1,953/837/30 |
| Example 18 | A-13 | 100 | B-1 | 10.8 | C-1 | 3 | D-1 | 4.5 | E-1/E-2/E-3 | 1,972/845/30 |
| Example 19 | A-13 | 100 | B-3 | 11.5 | C-2 | 3 | D-2 | 1.7 | E-1/E-2/E-3 | 1,953/837/30 |
| Example 20 | A-14 | 100 | B-2 | 10.8 | C-1 | 3 | D-1 | 4.5 | E-1/E-2/E-3 | 1,972/845/30 |
| Example 21 | A-14 | 100 | B-3 | 11.5 | C-2 | 3 | D-3 | 1.7 | E-1/E-2/E-3 | 1,953/837/30 |
| Example 22 | A-15 | 100 | B-2 | 9 | C-2 | 3 | D-2 | 1.7 | E-1/E-2/E-3 | 1,953/837/30 |
| Example 23 | A-16 | 100 | B-1 | 12.1 | C-2 | 3 | D-3 | 1.7 | E-1/E-2/E-3 | 1,953/837/30 |
| Example 24 | A-17 | 100 | B-3 | 11.5 | C-2 | 3 | D-3 | 1.7 | E-1/E-2/E-3 | 1,953/837/30 |
| Comparative Example 1 | A-8 | 100 | B-1 | 10.8 | C-1 | 3 | D-1 | 4.5 | E-1/E-2/E-3 | 1,972/845/30 |
| Comparative Example 2 | A-8 | 100 | B-1 | 12.1 | C-1 | 3 | D-2 | 1.7 | E-1/E-2/E-3 | 1,953/837/30 |

TABLE 2-continued

| | Polymer (A) | | Photoacid generator (B) | | Polymer (C) | | Acid diffusion controller (D) | | Solvent (E) | |
|---|---|---|---|---|---|---|---|---|---|---|
| | Type | Amount (parts by mass) | Type | Amount (parts by mass) | Type | Amount (parts by mass) | Type | Amount (parts by mass) | Type | Amount (parts by mass) |
| Comparative Example 3 | A-9 | 100 | B-1 | 10.8 | C-1 | 3 | D-1 | 4.5 | E-1/E-2/E-3 | 1,972/845/30 |
| Comparative Example 4 | A-9 | 100 | B-1 | 12.1 | C-1 | 3 | D-2 | 1.7 | E-1/E-2/E-3 | 1,953/837/30 |
| Comparative Example 5 | A-10 | 100 | B-1 | 10.8 | C-1 | 3 | D-1 | 4.5 | E-1/E-2/E-3 | 1,972/845/30 |
| Comparative Example 6 | A-10 | 100 | B-1 | 12.1 | C-1 | 3 | D-2 | 1.7 | E-1/E-2/E-3 | 1,953/837/30 |
| Comparative Example 7 | A-18 | 100 | B-2 | 9 | C-2 | 3 | D-2 | 1.7 | E-1/E-2/E-3 | 1,953/837/30 |

<Formation of Resist Pattern>

A lower-layer antireflective film material ("ARC66" manufactured by Brewer Science) was spin-coated onto a 12-inch silicon wafer using a spin coater ("CLEAN TRACK Lithius Pro i" manufactured by Tokyo Electron Ltd.), and baked at 205° C. for 60 seconds to form a lower-layer antireflective film (thickness: 105 nm). The radiation-sensitive resin composition was applied to the lower-layer antireflective film using the spin coater, prebaked (PB) (90° C., 60 sec), and cooled (23° C., 30 sec) to form a resist film (thickness: 0.100 μm). The resist film was exposed under the best focus conditions using an ArF immersion scanner ("NSR-S610C" manufactured by Nikon Precision Inc.) (NA: 1.3, quadrupole). The resist film was subjected to ¼ projection exposure. The size on the reticle was 0.220 μm chromium/0.440 μm pitch, and the mask bias was 0 nm. The resist film was subjected to PEB at a temperature shown in Table 3 for a time shown in Table 3 using a hot plate (CLEAN TRACK Lithius Pro i), and cooled (23° C., 30 sec). The resist film was puddle-developed (30 sec) using a developer shown in Table 3, and rinsed with 4-methyl-2-pentanol (7 sec). The resist film was then spin-dried at 2000 rpm for 15 seconds to form a 0.055 μm hole/0.110 μm pitch resist pattern.

<Evaluation>

The resist pattern thus formed was evaluated as described below. The results are shown in Table 3.

Sensitivity (mJ/cm$^2$)

An optimum dose at which a hole pattern having a diameter of 0.055 μm and a pitch of 0.110 μm was formed by reduced projection exposure via an immersion liquid (water) and a mask having a dot pattern formed so that a hole pattern having a diameter of 0.055 μm and a pitch of 0.110 μm was obtained, was taken as the sensitivity (mJ/cm$^2$). The measurement was performed using a scanning electron microscope ("CG4000" manufactured by Hitachi High-Technologies Corporation). It is desirable that the sensitivity be as low as possible.

Contrast Value γ

The resist dissolution contrast curve of the resist pattern was drawn (vertical axis: normalized thickness of resist, horizontal axis: ArF dose at intervals of 0.1 mJ/cm$^2$ (range: 3 to 23.0 mJ/cm$^2$)). The contrast value γ was calculated by the following expression.

$$\gamma = |\log_{10}(Q^0/Q^1)|^{-1}$$

Note that "$Q^0/Q^1$" indicates the slope of a straight line that approximates the measurement points of the rising edge of the resist dissolution contrast curve.

EL (%)

The dose range in which a hole pattern having a diameter within ±10% of 0.055 μm was formed by reduced projection exposure via a mask having a dot pattern formed so that a hole pattern having a diameter of 0.055 μm and a pitch of 0.110 μm was obtained, relative to the optimum dose, was taken as the exposure latitude (EL). A change in patterning capability due to a change in dose was determined to be small when the EL value was large.

DOF (μm)

The focus amplitude when a hole pattern having a diameter within ±10% of 0.055 μm was formed by reduced projection exposure via a mask having a dot pattern formed so that a hole pattern having a diameter of 0.055 μm and a pitch of 0.110 μm was obtained, was taken as the depth of focus (DOF). A change in patterning capability due to a change in focus was determined to be small when the DOF value was large.

CDU (μm)

A hole pattern (diameter: 0.055 μm) that was formed on the resist film on the substrate at the optimum dose was observed from above using a scanning electron microscope ("CG4000" manufactured by Hitachi High-Technologies Corporation). The diameter was measured at arbitrary points, and a variation 3σ in diameter was evaluated. A case where the variation 3σ was 0.003 μm or less was evaluated as "Acceptable", and a case where the variation 3σ was more than 0.003 μm was evaluated as "Unacceptable".

MEEF

A hole pattern having a pitch of 0.110 μm was formed at the optimum dose using a mask pattern designed so that the target size of a hole pattern formed by reduced projection exposure was 0.051 μm, 0.053 μm, 0.057 μm, or 0.059 μm. A graph was drawn by plotting the target size (μm) of the hole pattern formed by reduced projection exposure (horizontal axis) and the size (μm) of the hole pattern formed on the resist film on the substrate by reduced projection exposure (vertical axis), and the slope of the straight line of the graph was calculated as the mask error enhancement factor (MEEF). The mask reproducibility was determined to be better as the MEEF (slope of straight line) was closer to 1. A case where 1.1≦MEEF<4.5 was evaluated as "Acceptable", and a case where 4.5≦MEEF was evaluated as "Unacceptable".

TABLE 3

| | PEB Temperature (° C.) | Time (s) | Developer | Sensitivity (mJ/cm$^2$) | a | EL (%) | DOF (μm) | CDU (μm) | MEEF |
|---|---|---|---|---|---|---|---|---|---|
| Example 1 | 105 | 60 | Butyl acetate | 11.0 | 16.5 | 17.2 | 0.18 | 0.0020 | 3.8 |
| | 105 | 60 | Methyl amyl ketone | 15.0 | 20.5 | 16.9 | 0.18 | 0.0020 | 3.9 |
| Example 2 | 105 | 60 | Butyl acetate | 19.0 | 13.5 | 16.4 | 0.18 | 0.0021 | 3.8 |
| | 105 | 60 | Methyl amyl ketone | 22.0 | 16.3 | 15.3 | 0.18 | 0.0022 | 4.0 |

TABLE 3-continued

| | PEB Temperature (°C.) | Time (s) | Developer | Sensitivity (mJ/cm$^2$) | a | EL (%) | DOF (μm) | CDU (μm) | MEEF |
|---|---|---|---|---|---|---|---|---|---|
| Example 3 | 105 | 60 | Butyl acetate | 13.0 | 16.1 | 16.9 | 0.18 | 0.0020 | 3.9 |
| | 105 | 60 | Methyl amyl ketone | 16.0 | 19.2 | 15.8 | 0.18 | 0.0021 | 3.9 |
| Example 4 | 105 | 60 | Butyl acetate | 18.0 | 13.5 | 16.1 | 0.18 | 0.0020 | 4.0 |
| | 105 | 60 | Methyl amyl ketone | 21.0 | 15.6 | 15.0 | 0.18 | 0.0021 | 4.0 |
| Example 5 | 105 | 60 | Butyl acetate | 14.0 | 8.2 | 15.1 | 0.18 | 0.0021 | 4.0 |
| | 105 | 60 | Methyl amyl ketone | 16.0 | 9.9 | 14.4 | 0.18 | 0.0022 | 4.0 |
| Example 6 | 105 | 60 | Butyl acetate | 21.0 | 9.5 | 14.8 | 0.18 | 0.0022 | 4.0 |
| | 105 | 60 | Methyl amyl ketone | 22.0 | 11.3 | 14.7 | 0.18 | 0.0022 | 4.0 |
| Example 7 | 105 | 60 | Butyl acetate | 15.0 | 11.1 | 15.1 | 0.18 | 0.0024 | 4.0 |
| | 105 | 60 | Methyl amyl ketone | 16.0 | 13.8 | 14.9 | 0.18 | 0.0024 | 4.0 |
| Example 8 | 105 | 60 | Butyl acetate | 21.0 | 13.6 | 14.4 | 0.18 | 0.0023 | 4.0 |
| | 105 | 60 | Methyl amyl ketone | 22.0 | 16.6 | 14.8 | 0.18 | 0.0022 | 4.0 |
| Example 9 | 85 | 60 | Butyl acetate | 17.0 | 15.7 | 17.1 | 0.18 | 0.0021 | 3.8 |
| | 85 | 60 | Methyl amyl ketone | 18.0 | 20.3 | 17.0 | 0.18 | 0.0021 | 3.8 |
| Example 10 | 85 | 60 | Butyl acetate | 23.0 | 13.3 | 16.9 | 0.18 | 0.0020 | 3.8 |
| | 85 | 60 | Methyl amyl ketone | 25.0 | 15.8 | 16.7 | 0.18 | 0.0020 | 3.8 |
| Example 11 | 85 | 60 | Butyl acetate | 17.0 | 13.9 | 15.0 | 0.18 | 0.0022 | 4.0 |
| | 85 | 60 | Methyl amyl ketone | 19.0 | 19.2 | 15.0 | 0.18 | 0.0022 | 4.0 |
| Example 12 | 85 | 60 | Butyl acetate | 26.0 | 12.1 | 15.1 | 0.18 | 0.0023 | 4.0 |
| | 85 | 60 | Methyl amyl ketone | 27.0 | 13.1 | 15.7 | 0.18 | 0.0023 | 4.0 |
| Example 13 | 115 | 60 | Butyl acetate | 19.0 | 12.7 | 14.4 | 0.18 | 0.0023 | 4.1 |
| | 115 | 60 | Methyl amyl ketone | 21.0 | 17.8 | 14.7 | 0.18 | 0.0023 | 4.1 |
| Example 14 | 115 | 60 | Butyl acetate | 25.0 | 11.1 | 14.8 | 0.18 | 0.0023 | 4.1 |
| | 115 | 60 | Methyl amyl ketone | 29.0 | 12.9 | 14.4 | 0.18 | 0.0023 | 4.1 |
| Example 15 | 105 | 60 | Butyl acetate | 10.0 | 17.3 | 17.0 | 0.18 | 0.0021 | 3.8 |
| | 105 | 60 | Methyl amyl ketone | 14.0 | 22.1 | 16.4 | 0.18 | 0.0021 | 3.9 |
| Example 16 | 105 | 60 | Butyl acetate | 18.0 | 15.0 | 16.3 | 0.18 | 0.0021 | 3.9 |
| | 105 | 60 | Methyl amyl ketone | 21.0 | 18.0 | 15.4 | 0.18 | 0.0021 | 3.9 |
| Example 17 | 85 | 60 | Butyl acetate | 19.0 | 9.4 | 16.9 | 0.18 | 0.0019 | 3.7 |
| | 85 | 60 | Methyl amyl ketone | 22.0 | 11.2 | 15.8 | 0.18 | 0.0020 | 3.7 |
| Example 18 | 85 | 60 | Butyl acetate | 20.0 | 10.3 | 14.2 | 0.18 | 0.0023 | 3.9 |
| | 85 | 60 | Methyl amyl ketone | 21.0 | 11.3 | 13.1 | 0.18 | 0.0023 | 3.8 |
| Example 19 | 85 | 60 | Butyl acetate | 17.0 | 12.2 | 13.9 | 0.18 | 0.0022 | 4.0 |
| | 85 | 60 | Methyl amyl ketone | 19.0 | 13.2 | 13.8 | 0.18 | 0.0022 | 4.0 |
| Example 20 | 105 | 60 | Butyl acetate | 23.0 | 8.5 | 18.7 | 0.20 | 0.0020 | 3.7 |
| | 105 | 60 | Methyl amyl ketone | 24.0 | 9.0 | 18.1 | 0.20 | 0.0020 | 3.7 |
| Example 21 | 105 | 60 | Butyl acetate | 24.0 | 9.3 | 16.2 | 0.18 | 0.0021 | 3.9 |
| | 105 | 60 | Methyl amyl ketone | 25.0 | 10.2 | 15.8 | 0.18 | 0.0021 | 3.9 |
| Example 22 | 115 | 60 | Butyl acetate | 19.0 | 7.8 | 18.9 | 0.20 | 0.0020 | 3.7 |
| | 115 | 60 | Methyl amyl ketone | 20.0 | 9.0 | 18.1 | 0.20 | 0.0020 | 3.7 |
| Example 23 | 115 | 60 | Butyl acetate | 20.0 | 9.2 | 17.2 | 0.20 | 0.0019 | 3.7 |
| | 115 | 60 | Methyl amyl ketone | 21.0 | 9.9 | 16.8 | 0.20 | 0.0019 | 3.7 |
| Example 24 | 115 | 60 | Butyl acetate | 18.0 | 10.3 | 15.8 | 0.18 | 0.0021 | 4.0 |
| | 115 | 60 | Methyl amyl ketone | 20.0 | 11.7 | 13.8 | 0.18 | 0.0022 | 4.1 |
| | 115 | 60 | Methyl amyl ketone | 20.0 | 11.7 | 13.8 | 0.18 | 0.0022 | 4.1 |
| Comparative Example 1 | 105 | 60 | Butyl acetate | 14.0 | 35.9 | 10.9 | 0.15 | 0.0028 | 4.4 |
| | 105 | 60 | Methyl amyl ketone | 16.0 | 54.6 | 11.2 | 0.15 | 0.0027 | 4.4 |
| Comparative Example 2 | 105 | 60 | Butyl acetate | 19.0 | 33.3 | 11.8 | 0.12 | 0.0028 | 4.4 |
| | 105 | 60 | Methyl amyl ketone | 20.0 | 52.8 | 11.7 | 0.15 | 0.0027 | 4.6 |
| Comparative Example 3 | 105 | 60 | Butyl acetate | 16.0 | 3.7 | 9.1 | 0.12 | 0.0030 | 4.5 |
| | 105 | 60 | Methyl amyl ketone | 18.0 | 4.7 | 9.3 | 0.12 | 0.0031 | 4.5 |
| Comparative Example 4 | 105 | 60 | Butyl acetate | 21.0 | 3.1 | 9.4 | 0.12 | 0.0036 | 4.6 |
| | 105 | 60 | Methyl amyl ketone | 22.0 | 4.5 | 9.5 | 0.12 | 0.0035 | 4.6 |
| Comparative Example 5 | 105 | 60 | Butyl acetate | 17.0 | 3.4 | 8.9 | 0.12 | 0.0031 | 4.6 |
| | 105 | 60 | Methyl amyl ketone | 19.0 | 4.9 | 9.1 | 0.12 | 0.0033 | 4.6 |
| Comparative Example 6 | 105 | 60 | Butyl acetate | 22.0 | 2.9 | 9.2 | 0.12 | 0.0038 | 4.7 |
| | 105 | 60 | Methyl amyl ketone | 23.0 | 4.3 | 9.3 | 0.12 | 0.0037 | 4.7 |
| Comparative Example 7 | 115 | 60 | Butyl acetate | 19.0 | 3.8 | 8.2 | 0.10 | 0.0038 | 4.9 |
| | 115 | 60 | Methyl amyl ketone | 20.0 | 4.0 | 9.4 | 0.10 | 0.0037 | 4.9 |

As is clear from the results shown in Table 3, the radiation-sensitive resin compositions according to the examples of the invention exhibited sufficient sensitivity, and also exhibited an excellent EL, DOF, CDU, and MEEF.

The embodiments of the invention thus provides a radiation-sensitive resin composition that exhibits sufficient sensitivity, and also exhibits an excellent EL, DOF, CDU, and MEEF. The radiation-sensitive resin composition may suitably be used for production of semiconductor devices that are expected to be further miniaturized in the future.

Obviously, numerous modifications and variations of the present invention are possible in light of the above teachings. It is therefore to be understood that within the scope of the appended claims, the invention may be practiced otherwise than as specifically described herein.

What is claimed is:
1. A method for forming a resist pattern, comprising:
using a radiation-sensitive resin composition, a developer that includes an organic solvent in an amount of 80 mass % or more, and an ArF excimer laser beam as an exposure light, the radiation-sensitive resin composition comprising:

(A) an acid-labile group-containing polymer;

(B) a radiation-sensitive acid generator; and (D) an acid diffusion controller, wherein the acid diffusion controller (D) is at least one compound selected from the group consisting of a hydroxy group-containing tri(cyclo)alkylamine, an amide group-containing compound and a photodegradable base, and wherein a solubility of the radiation-sensitive resin composition to the organic solvent decreases upon the exposure to the ArF excimer laser, and a contrast value γ calculated from a resist dissolution contrast curve obtained by changing only a dose of the ArF excimer laser is 5.0 to 30.0.

2. The method for forming a resist pattern according to claim 1, wherein the organic solvent is at least one organic solvent selected from the group consisting of alkyl carboxylates having 3 to 7 carbon atoms and dialkyl ketones having 3 to 10 carbon atoms.

3. The method for forming a resist pattern according to claim 1, wherein the acid-labile group-containing polymer (A) includes a structural unit (I) shown by a formula (1) and a structural unit (II) shown by a formula (2),

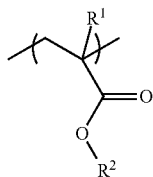

(1)

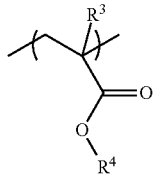

(2)

wherein $R^1$ represents a hydrogen atom, a fluorine atom, a methyl group, or a trifluoromethyl group, $R^2$ represents a monovalent acid-labile group that is a linear or branched hydrocarbon group having 1 to 9 carbon atoms or an alicyclic group having 4 to 20 carbon atoms, wherein the alicyclic group is unsubstituted or at least one of the hydrogen atoms of the alicyclic group is substituted with a substituent, $R^3$ represents a hydrogen atom, a fluorine atom, a methyl group, or a trifluoromethyl group, and $R^4$ represents a monovalent non-acid-labile group that has an alicyclic structure and includes a polar group, wherein $R^4$ does not include a lactone-containing group or a cyclic carbonate-containing group.

4. The method for forming a resist pattern according to claim 3, wherein $R^4$ represents a group that has a polyalicyclic structure, and that includes a carbonyl group, a hydroxyl group, or a cyano group as the polar group.

5. The method for forming a resist pattern according to claim 3, wherein a content of the structural unit (II) in the acid-labile group-containing polymer (A) is from 1 to 30 mol %.

6. The method for forming a resist pattern according to claim 3, wherein the acid-labile group-containing polymer (A) further includes a structural unit (III) that includes a lactone-containing group or a cyclic carbonate-containing group.

* * * * *